US008067724B2

(12) United States Patent
Hochberg et al.

(10) Patent No.: US 8,067,724 B2
(45) Date of Patent: Nov. 29, 2011

(54) ALL-OPTICAL INTEGRATED PHOTONIC CLOCK HAVING A DELAY LINE FOR PROVIDING GATE SIGNAL TO A GATE WAVEGUIDE

(75) Inventors: Michael J. Hochberg, Seattle, WA (US); Tom Baehr-Jones, Seattle, WA (US)

(73) Assignee: University of Washington, Seattle, WA (US)

( * ) Notice: Subject to any disclaimer, the term of this patent is extended or adjusted under 35 U.S.C. 154(b) by 245 days.

(21) Appl. No.: 12/455,008

(22) Filed: May 27, 2009

(65) Prior Publication Data

US 2011/0057091 A1    Mar. 10, 2011

Related U.S. Application Data

(63) Continuation-in-part of application No. PCT/US2009/033516, filed on Feb. 9, 2009.

(60) Provisional application No. 61/056,508, filed on May 28, 2008, provisional application No. 61/027,022, filed on Feb. 7, 2008.

(51) Int. Cl.
*G01J 1/04* (2006.01)
(52) U.S. Cl. .............................. 250/227.12; 250/227.21
(58) Field of Classification Search ................ 250/239, 250/227.11, 227.12, 227.21, 227.24, 227.27; 385/24, 33, 39, 42, 1–4; 356/317
See application file for complete search history.

(56) References Cited

U.S. PATENT DOCUMENTS 6,778,730 B2 *   8/2004   Hironishi .................. 385/24

* cited by examiner

*Primary Examiner* — Que T Le
(74) *Attorney, Agent, or Firm* — Milstein Zhang & Wu LLC; Joseph B. Milstein

(57) ABSTRACT

An all-optical integrated photonic clock, systems employing the same, and methods of making and using the same. Illustrative examples are provided based on silicon semiconductor technology that employs rectangular waveguides fabricated on SOI wafers. In some embodiments, the clock can provide an optical timing signal. In some embodiments, the clock can provide a jitter-free electrical signal derived from the clock by use of a high speed photodetector.

19 Claims, 18 Drawing Sheets

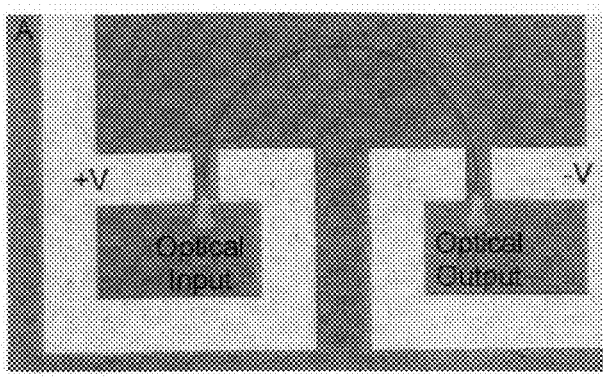
FIG. 8A
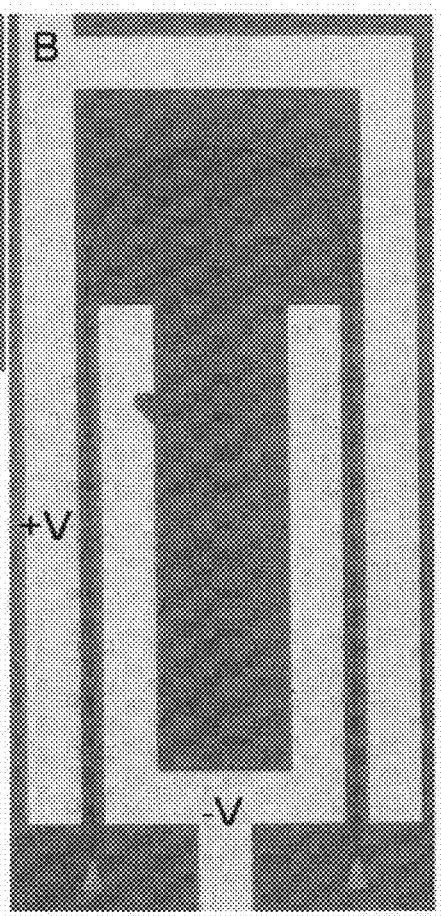
FIG. 8B
FIG. 8C
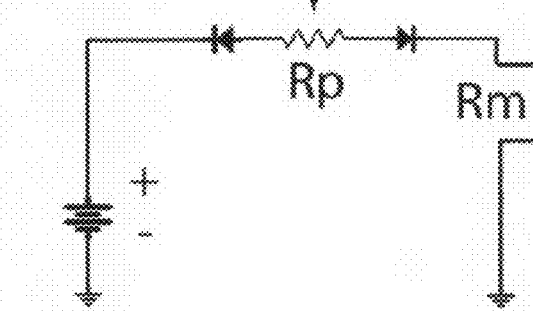
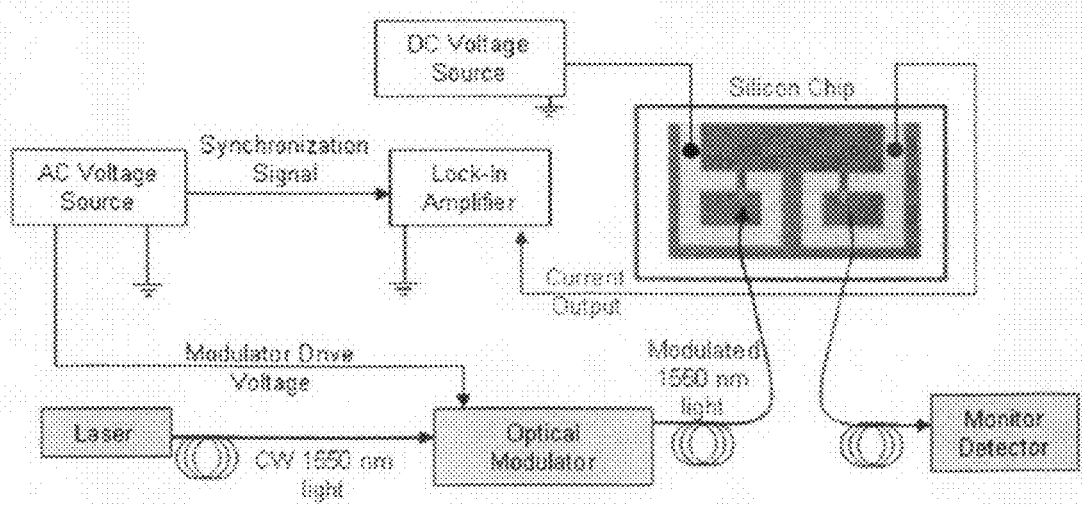
FIG. 8D

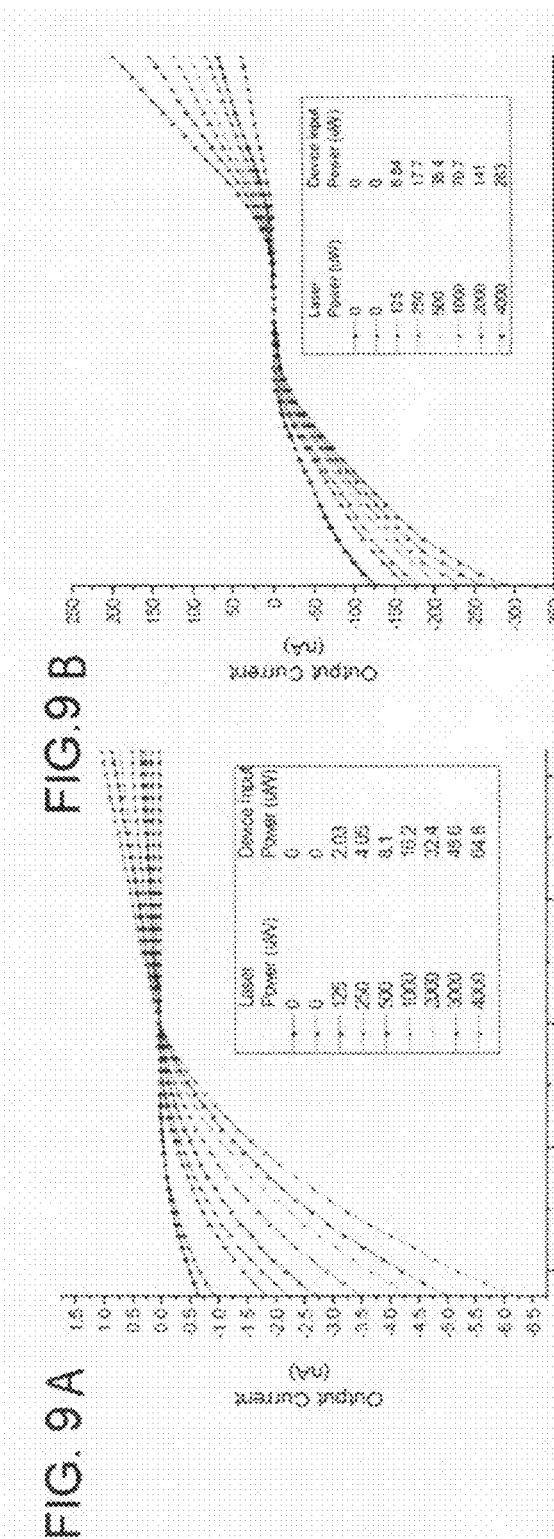
FIG. 9A
FIG. 9B
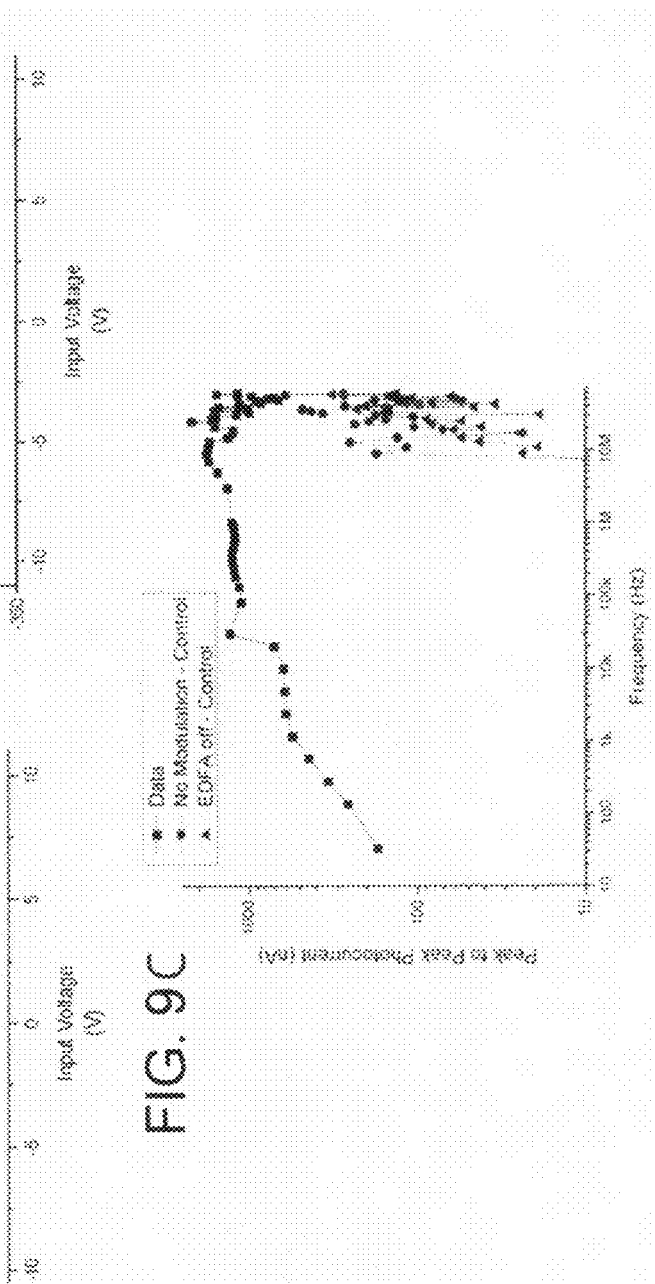
FIG. 9C

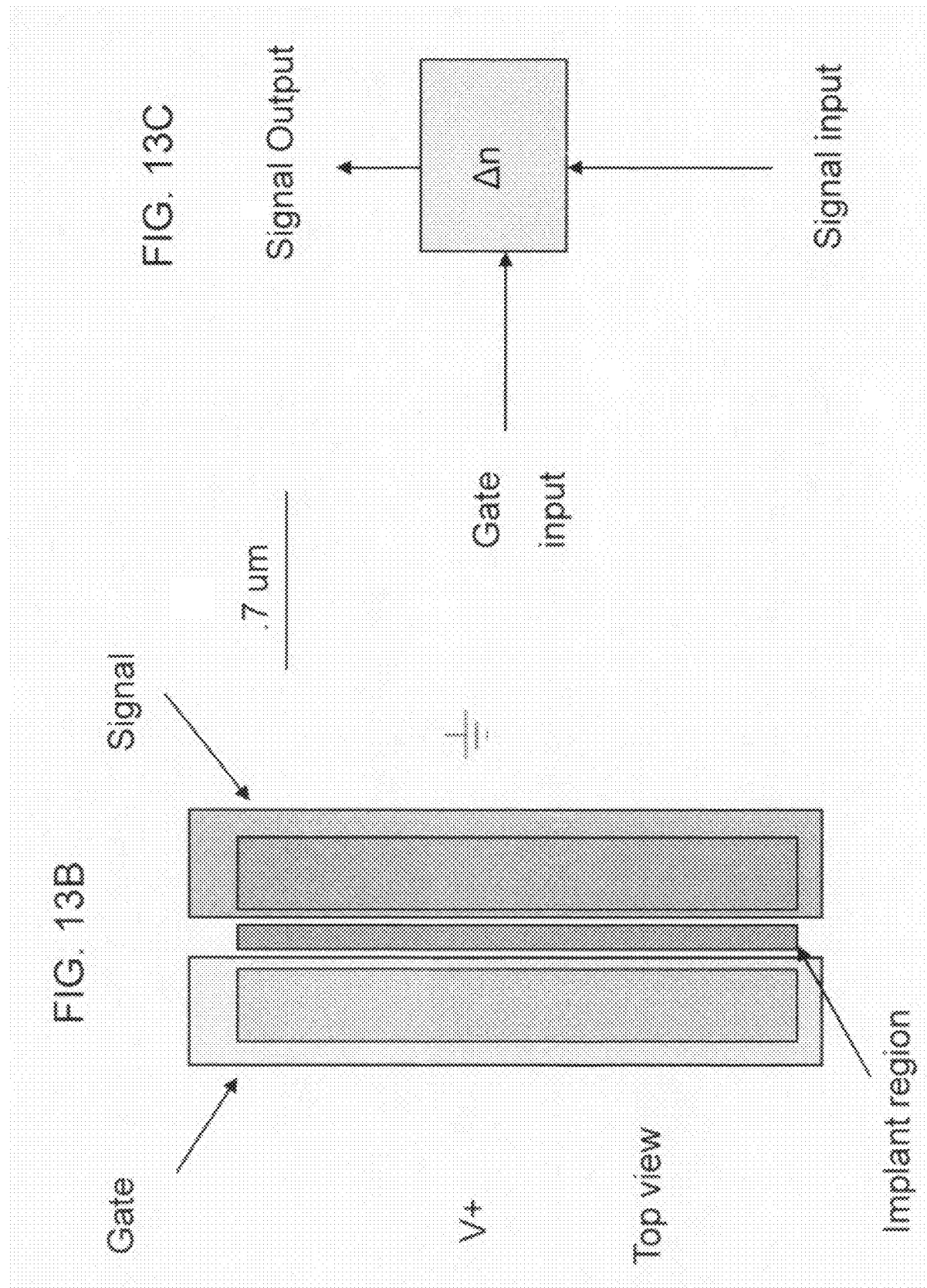

US 8,067,724 B2

ALL-OPTICAL INTEGRATED PHOTONIC CLOCK HAVING A DELAY LINE FOR PROVIDING GATE SIGNAL TO A GATE WAVEGUIDE

CROSS-REFERENCE TO RELATED APPLICATIONS

This application claims priority to and the benefit of co-pending U.S. provisional patent application Ser. No. 61/056,508, filed May 28, 2008, which application is incorporated herein by reference in its entirety, and this application is a continuation-in-part of co-pending International Application PCT/US09/33516, filed Monday Feb. 9, 2009, which designated the United States, and which itself claimed priority to and the benefit of then co-pending U.S. provisional patent application Ser. No. 61/027,022, filed Feb. 7, 2008, each of which applications is incorporated herein by reference in its entirety.

STATEMENT REGARDING FEDERALLY FUNDED RESEARCH OR DEVELOPMENT

The U.S. Government has certain rights in this invention pursuant to Grant No. HR0011-04-1-0054 awarded by DARPA and Grant No. FA9550-04-1-0434 awarded by AFOSR.

BACKGROUND OF THE INVENTION

1. Field of the Invention

The invention relates to all-optical modulators in general and particularly to a silicon all-optical integrated photonic clock that employs single photon absorption.

2. Description of Related Art

All-optical, low-power modulation is a major goal in photonics. Because of their high mode-field concentration and ease of manufacturing, nanoscale silicon waveguides offer an intriguing platform for photonics. To the best knowledge and belief of the inventors, all-optical modulators built with silicon photonic circuits have relied on either two-photon absorption (TPA) or the Kerr effect. Both effects are weak in silicon, and require extremely high (~5 W) peak optical power levels to achieve modulation.

Almeida et al ("All-optical control of light on a silicon chip," *Nature*, vol. 431, pp. 1081-1084, 2004.) and Foerst et al ("High-speed all-optical switching in ion-implanted silicon-on-insulator microring resonators," *Optics Letters*, vol. 32, pp. 2046-2048, 2007) have recently demonstrated an all-optical modulator with single-photon absorption-based carrier injection using visible light. This approach has severe limitations. Because of the disparate wavelengths for gate and signal, these devices cannot be cascaded into circuits that require feedback.

There is a need for an all-optical clock that can provide accurate timing signals with reduced jitter.

SUMMARY OF THE INVENTION

In one aspect, the invention relates to an all-optical clock. The all-optical clock comprises a substrate having a surface; a waveguide structure having a gate waveguide and at least one signal waveguide having an input port and an output port, the waveguide structure disposed adjacent the surface of the substrate; the gate waveguide of the waveguide structure configured to receive a gate signal; the input port of the at least one signal waveguide configured to receive an input optical signal; the output port of the at least one signal waveguide configured to provide as output an output signal; a signal splitter having an input port and at least two output ports, the signal splitter configured to receive as an input signal the output signal from the output port of the at least one signal waveguide, and configured to provide as an output at each of the at least two output ports a respective portion of the received input signal, one of the at least two output ports configured to deliver the respective portion of the received input signal to a user-selected output for later use; and a delay line having an input port configured to receive a signal from one of the at least two output ports of the signal splitter, and an output port configured to deliver the signal received from the splitter to the gate as the gate signal, the delay line configured to provide the gate signal with a selected delay between a time that the signal is received at the input port of the delay line and the signal is delivered to the gate.

In one embodiment, the at least one signal waveguide is configured as one leg of a Mach-Zehnder interferometer. In one embodiment, the waveguide structure comprises a semiconductor material. In one embodiment, the semiconductor material is silicon. In one embodiment, the semiconductor material is a selected one of silicon, germanium, tin, and alloys thereof. In one embodiment, the semiconductor material is a selected one of a III/V compound and alloys thereof. In one embodiment, the semiconductor material comprises dopants. In one embodiment, the all-optical clock further comprises a ring resonator. In one embodiment, the all-optical clock comprises a junction selected from a P-N junction and a P-I-N junction. In one embodiment, the all-optical clock further comprises a photodetector configured to receive the optical output signal and configured to provide an electrical output signal representing substantially an electrical equivalent of the optical output signal.

In another aspect, the invention provides a method of operating an all-optical clock. The all-optical clock comprises a substrate having a surface; a waveguide structure having a gate waveguide and at least one signal waveguide having an input port and an output port, the waveguide structure disposed adjacent the surface of the substrate; the gate waveguide of the waveguide structure configured to receive a gate signal; the input port of the at least one signal waveguide configured to receive an input optical signal; the output port of the at least one signal waveguide configured to provide as output an output signal; a signal splitter having an input port and at least two output ports, the signal splitter configured to receive as an input signal the output signal from the output port of the at least one signal waveguide, and configured to provide as an output at each of the at least two output ports a respective portion of the received input signal, one of the at least two output ports configured to deliver the respective portion of the received input signal to a user-selected output for later use; and a delay line having an input port configured to receive a signal from one of the at least two output ports of the signal splitter, and an output port configured to deliver the signal received from the splitter to the gate as the gate signal, the delay line configured to provide the gate signal with a selected delay between a time that the signal is received at the input port of the delay line and the signal is delivered to the gate. The method comprises the steps of applying to the input port of the at least one signal waveguide an input optical signal; and detecting at the output port of the at least one signal waveguide an optical output signal configured as a periodic signal.

In one embodiment, the all-optical clock further comprises a photodetector, and wherein the photodetector is configured to receive the optical output signal and configured to provide an electrical output signal representing substantially an electrical equivalent of the optical output signal. In one embodiment, the at least one signal waveguide is one leg of a Mach-Zehnder interferometer. In one embodiment, the waveguide structure comprises a semiconductor material. In one embodiment, the semiconductor material is silicon. In one embodiment, the semiconductor material is a selected one of silicon, germanium, tin, and alloys thereof. In one embodiment, the semiconductor material is a selected one of a III/V compound and alloys thereof. In one embodiment, the semiconductor material comprises dopants. In one embodiment, the all-optical clock comprises a junction selected from a P-N junction and a P-I-N junction.

In yet another aspect, the invention features a all-optical clock comprising: an all-optical transistor having an input port, an output port and a gate, the all-optical transistor configured to operate in a single photon absorption mode, an output signal of the all optical transistor configured to be directed back to the gate port by way of a delay line, the delay line having a propagation delay, the propagation delay configured to provide a time standard for an oscillation frequency of the all optical transistor.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 8(a) is a diagram of a detector of type A;

FIG. 8(b) is a diagram of a detector of type B;

FIG. 8(c) is a diagram of an equivalent circuit;

FIG. 8(d) is a diagram of an experimental setup;

FIG. 9(a) is a graph showing DC I-V curves for device A1;

FIG. 9(b) is a graph showing DC I-V curves for device B1;

FIG. 9(c) is a diagram showing the peak to peak output photocurrent of device B2 as a function of frequency;

FIG. 13(b) is a diagram in plan view of a portion of an illustrative all-optical transistor;

FIG. 13(c) is a schematic diagram illustrating the logical layout of an illustrative all-optical transistor;

DETAILED DESCRIPTION OF THE INVENTION

Figure 1:
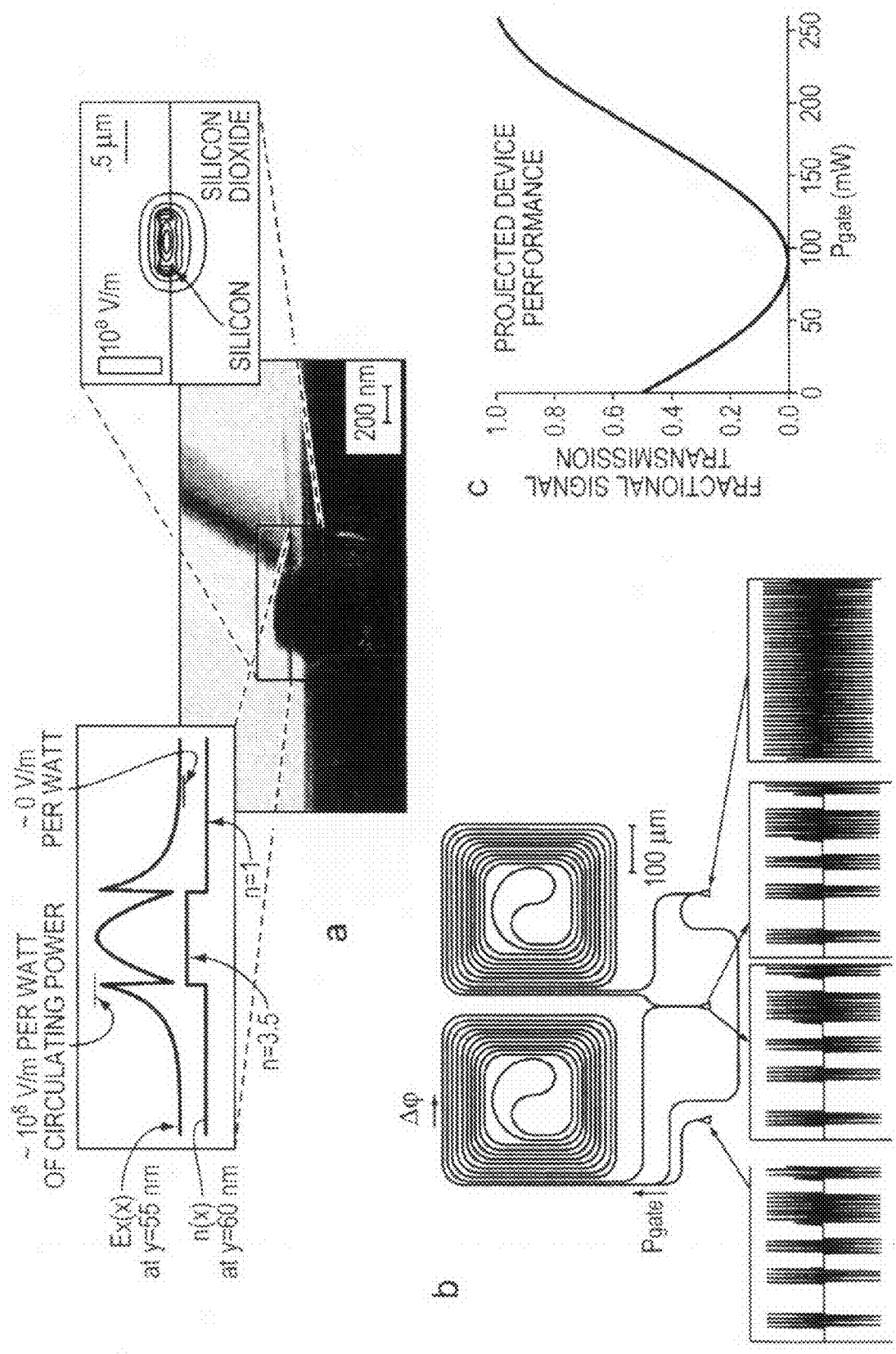
FIG. 1(a) through FIG. 1(c) illustrate an exemplary embodiment a waveguide that is useful to provide single photon absorption modulator device layout, with some of the properties of the modulator, according to principles of the invention.
FIG. 1(d) is a SEM micrograph of a detector device of type B.
FIG. 1(e) is another SEM micrograph of a device of type B.

We first describe the methods of fabrication of an optical transistor. We then describe the application of such a device to produce a variety of all-optical integrated photonic clock apparata. The description of an optical transistor that we have presented in pending PCT application PCT/US09/33516 is incorporated herein by reference in its entirety. All-optical devices can be expected to provide a significant advantage with regard to devices and systems that can be constructed. However, it is also possible that all-optical devices will be able to provide data processing and signaling improvements in the circumstance that the output optical signals are converted to electrical signals, for example by the use of high speed photodetectors. Not only will such all-optical devices provide improvements in the optical domain, but also significant improvements in the electrical domain as well, for example by making possible extremely high-frequency signals having very low jitter and low inherent noise.

Because silicon has a bandgap of 1.12 eV, it is an ideal material platform for near-infrared integrated optical circuits. Electrically driven modulation and an optically pumped silicon laser have been previously demonstrated. For all-optical signal processing applications, low-power all-optical modulation is very useful and would represent an appreciable advance. Applications that are contemplated include optical buffering, all-optical wavelength conversion, and all-optical computation.

Silicon is an extremely attractive material platform for integrated optics at telecommunications wavelengths, particularly for integration with CMOS circuits. Developing detectors and electrically pumped lasers at telecom wavelengths are the two main technological hurdles before silicon can become a comprehensive platform for integrated optics. We describe a photocurrent in unimplanted SOI ridge waveguides. It is believed that the photocurrent is a consequence of surface state absorption. By electrically contacting the waveguides, a photodetector with a responsivity of 36 mA/W and quantum efficiency of 2.8% is demonstrated. The response is shown to have minimal falloff at speeds of up to 60 MHz.

Silicon is also a useful material because of its low cost as compared to many other semiconductors, and because it has a very well developed and well understood processing technology. Nevertheless, other semiconductor materials might in principle be used instead of silicon in a single-photon absorption device. For some optical wavelengths, other materials might be advantageous as compared to silicon.

All-Optical Mach-Zehnder Modulator

We describe an all-optical Mach-Zehnder modulator based on a single-photon absorption (SPA) process, fabricated entirely in silicon. Our single-photon absorption modulator is based on a process by which a single photon at 1.55 μm is absorbed and an apparently free-carrier mediated process causes an index shift in silicon, even though the photon energy does not exceed that of silicon's bandgap. We demonstrate all-optical modulation with a gate response of 1 degree/mW at 0.5 GBit/s. This is over an order of magnitude more responsive than typical previously demonstrated devices. Even without resonant enhancement, further engineering may enable all optical modulation with less than 10 mW of gate power required for complete extinction, and speeds of 5 GBit/s or higher.

We have demonstrated all-optical modulation in silicon with a novel single photon mechanism. Our device achieves modulation at power levels an order of magnitude lower than typical all-optical modulators in silicon. We believe that bandwidths in the tens of gigahertz and peak modulation powers on the scale of 10 mW are achievable. With such performance, it will be possible to obtain broadband all-optical signal gain, enabling chip-scale optical transistors to be integrated into all-optical integrated logic circuits.

Figures 10A, 10B:
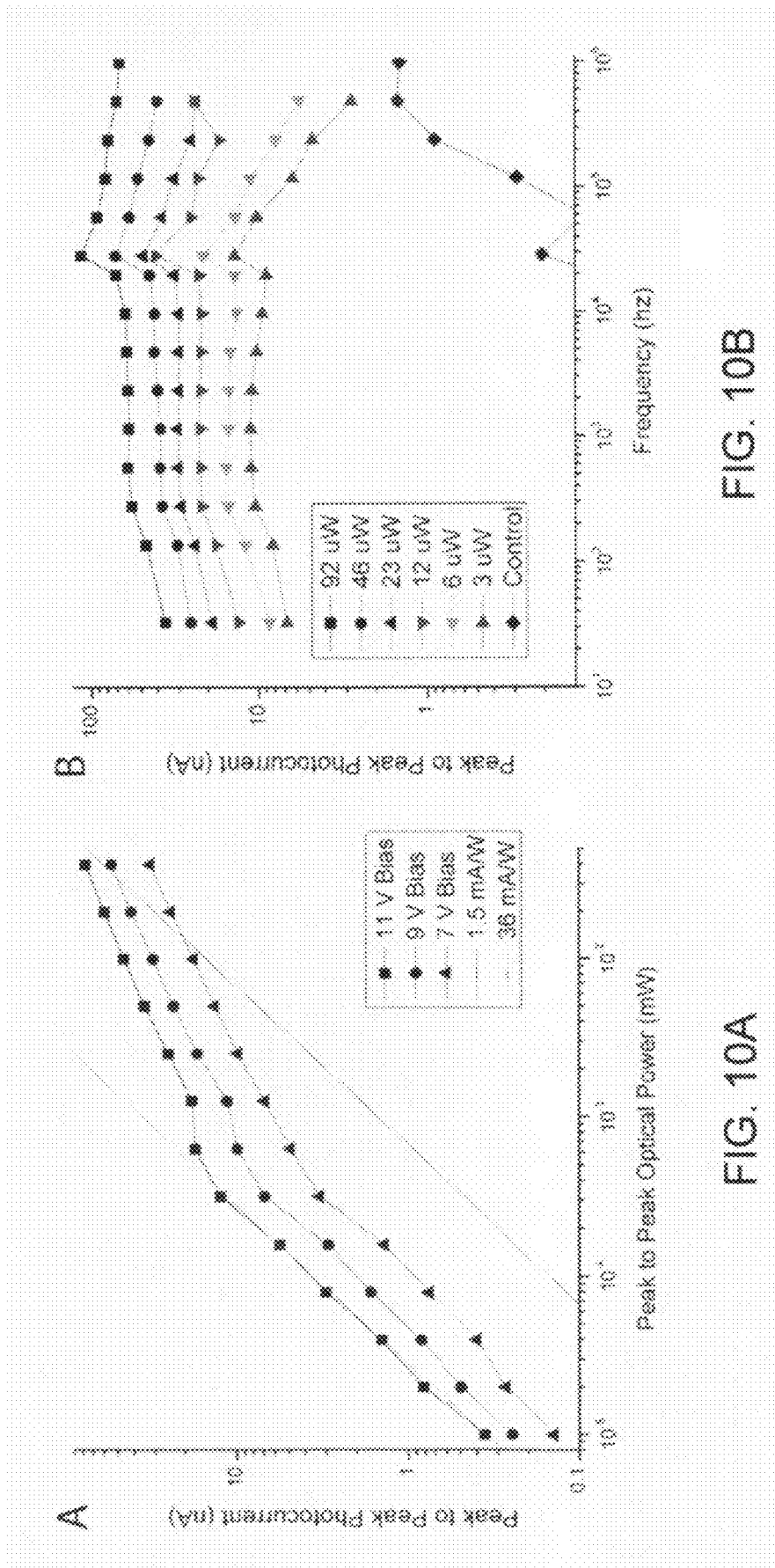
FIG. 10(a) is a graph showing the photocurrent as a function of propagating laser power for several bias voltages.
FIG. 10(b) is a graph showing the photocurrent in peak to peak nA of the device for a 11 V bias voltages and several peak to peak laser powers as a function of frequency up to 1 MHz.
Figure 11A:
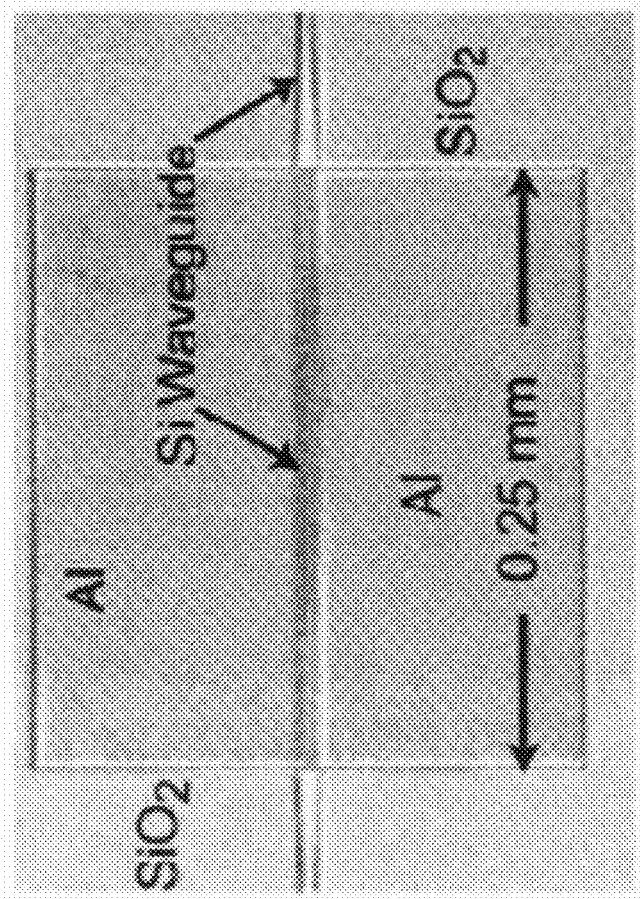
FIG. 11(a) is a diagram in plan of a prior art optical modulator fabricated using ion implantation to produce damage in a silicon waveguide.
Figure 11B:
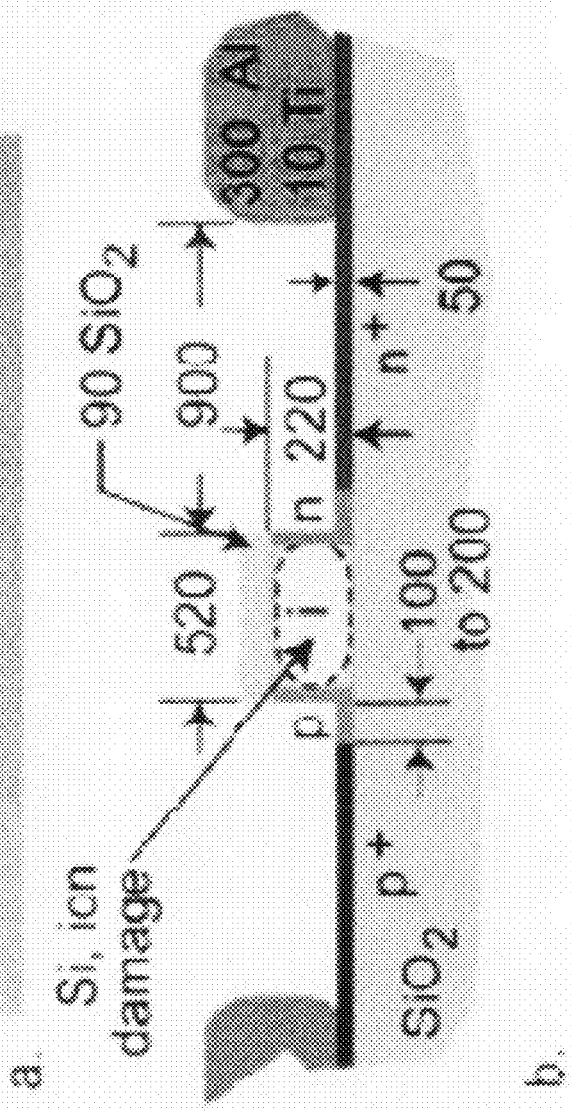
FIG. 11(b) is a diagram in elevation of the prior art optical modulator illustrated in FIG. 11(a)

Geis et al. ("CMOS-Compatible All-Si High-Speed Waveguide Photodiodes With High Responsivity in Near-Infrared Communication Band," *IEEE Photonics Technology Letters*, vol. 19, pp. 152-154, 2007) demonstrated an efficient photodetector at 1.55 μm based on an single-photon absorption mechanism, achieving greater than 50% quantum efficiency at speeds up to 10 GHz. This photodetector utilized absorption centers created in a waveguide by ion damage (e.g., implanting silicon with silicon ions), which enabled absorption of photons at energies below the bandgap, which absorption appears to be correlated with the defects in the volume of the semiconductor. Single photon absorption was also observed in undamaged samples, and attributed to surface-state absorption. The photodetector is illustrated in FIG. 10(a) and FIG. 10(b). Similar linear photocurrent responses have been observed, both due to volume defects and due solely to the waveguide surface states, for example in J. D. B. Bradley, et al., "Silicon waveguide-integrated optical power monitor with enhanced sensitivity at 1550 nm," *Applied Physics Letters*, vol. 86, art. no. 241103, 2005, in Y. Liu et al., "In-line channel power monitor based on helium ion implantation in silicon-on-insulator waveguides," *IEEE Photonics Technology Letters*, vol. 18, pp. 1882-1884, 2006, and in T. Baehr-Jones, M. Hochberg, and A. Scherer, "Photodetection in silicon beyond the band edge with surface states," *Optics Express*, vol. 16, pp. 1659-1668, 2008. It has been hypothesized that defects create mid-bandgap states, enabling an electron to reach the conduction band from the valence band, but the precise mechanism is not yet fully understood. These investigations did not deal with modulation effects, but rather simply with photodetection.

It is well known that surface states cause optical loss in silicon waveguides. Most low-loss geometries involve large silicon waveguides, on the scale of 0.450 μm×0.250 μm and 2 μm×0.9 μm, which minimize the interaction of the optical mode with surface states. In our single-photon absorption modulator, we use a smaller 0.5×0.1 μm ridge waveguide resulting in a very large electric field at the etched surfaces. The fabrication of ridge waveguides in silicon, such as the 0.5×0.1 μm ridge waveguide, has previously been described in several of our previous patent documents, including U.S. Pat. Nos. 7,200,308 and 7,424,192, and in published application US2007/0035800 A1, all of which are incorporated by reference herein in their entirety. By electrically contacting the silicon waveguides, we have demonstrated that a linear photocurrent can be observed, with a quantum efficiency of 2.8%. We have identified that the region responsible for the photocurrent was the waveguide surface, though the precise mechanism was not determined.

Mach-Zehnder Device Layout and Test Layout

We use the surface-absorption process to build an all-optical modulator. We introduce a gate optical mode into one arm of a Mach-Zehnder interferometer. The single-photon absorption process occurs, and an unbalanced refractive index shift occurs in one of the arms, causing constructive or destructive interference in a signal beam that is provided to the input port of the Mach-Zehnder interferometer, with the output observed at an output port of the Mach-Zehnder interferometer.

FIG. 1(a) is diagram showing a SEM micrograph of cleaved ridge waveguide with modal patterns illustrated to the left and with calculated electrical field contours shown to the right. FIG. 1(b) is a diagram showing an optical image of the single-photon absorption modulator, with the gate and signal optical modes illustrated. $P_{gate}$ indicates the location that the gate optical mode is mixed into a Mach-Zehnder arm with a y-junction, and begins to cause a phase delay, labeled $\Delta\phi$, in the signal mode. The input port to the Mach-Zehnder is indicated by the port on the lower right of the figure having an arrow pointing thereto, indicating that the input signal is applied to that port. The output port of the Mach-Zehnder is the port in the bottom middle of the figure having two arrows pointing away therefrom, indicating that the output signal is provided at that port. The output port of the Mach-Zehnder is so labeled explicitly in FIG. 2(a). The gate power as reported in the paper is always the propagating power at this point in the waveguide. Thought not visible in this image, there is a corresponding y-junction on the opposing arm, ensuring that the Mach-Zehnder is balanced. FIG. 1(c) is a diagram showing the idealized transmission of the signal is shown, for a device with a gate response of 1 degree/mW, and a bias point of 90 degrees.

Referring to FIG. 1, showing the device geometry, the arm lengths of the devices that we tested ranged from 0.75 to 1.25 cm, and the arms were unequal in length within each device, with differences ranging from 150 μm to 600 μm. This length inequality allows us to control the intrinsic phase shift between the arms by tuning the signal wavelength. Typical waveguide losses in these devices were 6 dB/cm. Input coupling is achieved from a polarization-maintaining fiber array via grating couplers.

The device performance is best characterized by the phase shift induced per unit gate power. A gate response of 0.1 degree/mW corresponds to around 180 mW for complete extinction of the signal mode, if the gate response remains linear at higher powers. The power level required to obtain extinction of the signal, which we call Pπ, is analogous to the Vπ associated with an electrooptic modulator.

Fabrication Information

Devices were fabricated in electronics-grade silicon-on-insulator (SOI) wafers supplied by Soitec (Soitec USA Inc., 2 Centennial Drive, Peabody, Mass. 01960, http://www.soitec.com/en/index.php), doped at around $10^{15}$ dopant atoms (Boron)/$cm^3$. No implant or irradiation was performed on the silicon material. The starting silicon material was thinned to about 110 nm by dry oxidation, separated into small chips, and patterned with electron-beam lithography using a 100-kV electron-beam writer using hydrogen silsesquioxane (HSQ) resist. The samples were etched with chlorine in an inductively coupled plasma etcher. No cladding layer was deposited. The SOI wafer serves as a substrate for the fabricated devices.

Testing with Pseudo-Random Bit Sequence

Initial testing was done by modulating the gate beam with a pseudo-random bit sequence. A modulated gate optical mode on the order of 25 mW propagating power in the waveguide with 50% extinction was used, and this was directed into the gate port of the modulator. To assist the measurements and enhance the effect by increasing the optical power levels, two Erbium Doped Fiber Amplifiers (EDFA) were used. The signal beam was set to a wavelength such that there was an intrinsic 90 degree modulator bias point. We obtained eye diagrams at 300 and 500 MBit/sec, as shown in FIG. 2.

FIG. 2(a) is a diagram showing an illustrative experimental setup used to measure the response of the single-photon absorption modulator, and used to obtain an eye-pattern. FIG. 2(b) is a diagram showing an eye-pattern obtained at 300 MBit/sec. FIG. 2(c) is a diagram showing an eye-pattern obtained at 500 MBit/sec.

As shown in FIG. 2(a), the gate is supplied with a signal generated using a laser source feeding a signal to an electro-optical modulator, such as a lithium niobate ($LiNbO_3$) electro-optical modulator that is driven by an electrical pseudo-random binary sequence (PRBS) generator. The signal from the electro-optical modulator is amplified by an EDFA, and applied to the gate port. The input signal applied to the input port of the Mach-Zehnder is generated using a laser signal that is amplified by an EDFA. The output from the Mach-Zehnder is observed after being passed through a spectral filter, and detected with a photodiode that provides an electrical signal representative of the output of the Mach-Zehnder. The electrical signal is amplified with an RF amplifier, and provided to the input of a digital oscilloscope. The signal is processed with a digital high pass filter and displayed to a user or recorded as may be desired.

Figure 2:
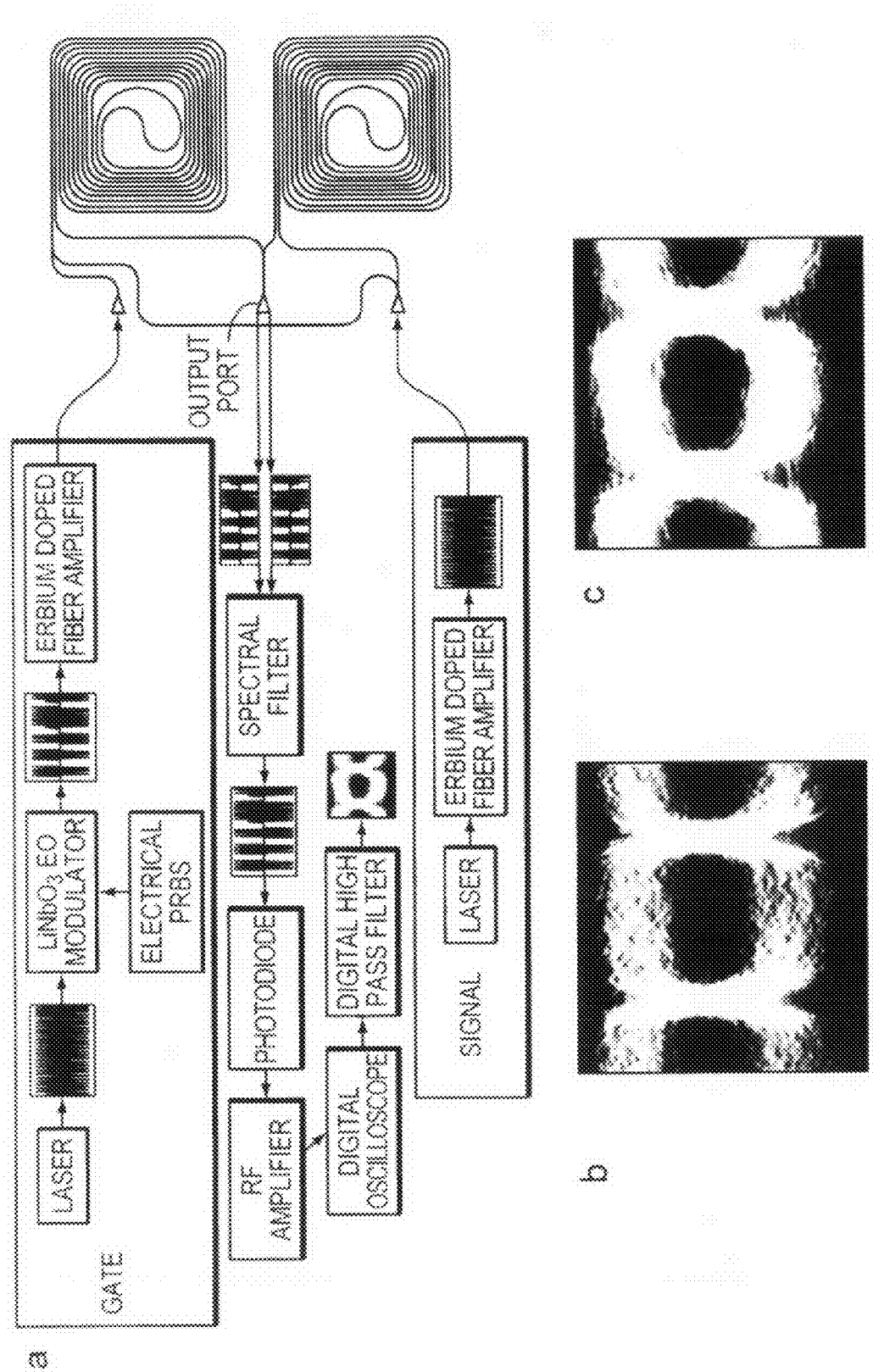
FIGS. 2(A-C) are diagrams showing an illustrative experimental setup used to measure the response of the single photon absorption modulator, and showing eye-patterns observed, according to principles of the invention.

It is important to note in FIG. 2 that the spectral filter placed in the modulator output preferentially removes the original gate optical frequency, leaving only the signal frequency. As a result, the open eye pattern demonstrates that the bit pattern on the gate mode has been transferred via the all-optical modulator to the signal mode. This type of operation is likely to be of use in the construction of future all-optical networks.

Characterization with Sinusoidal Excitation

Figure 3:
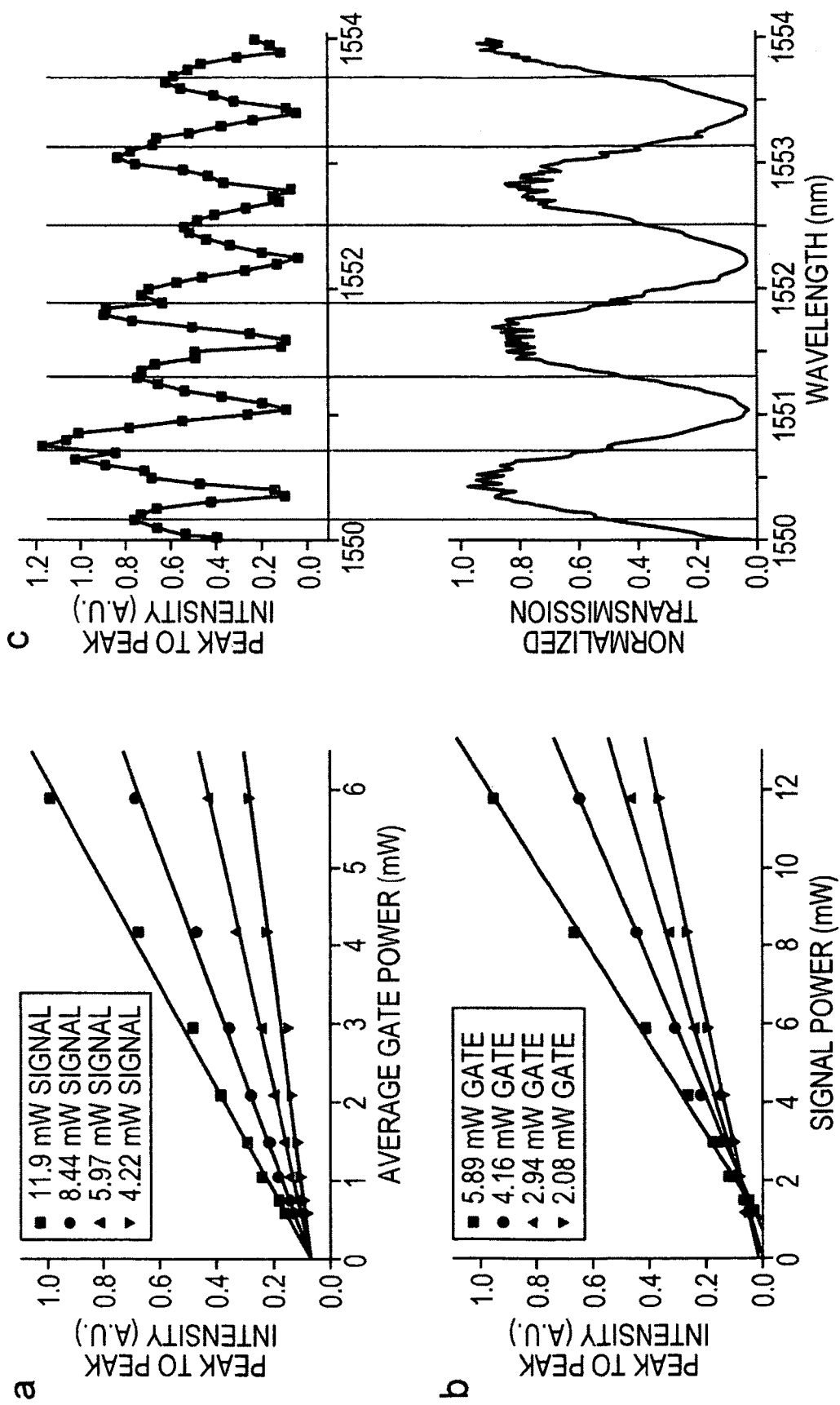
FIGS. 3(A-C) are diagrams showing the results of lock-in amplifier assisted measurements, according to principles of the invention.

To better understand the device response with lower gate powers, and to characterize the frequency dependence of the mechanism, testing was performed with a gate having a sinusoidal intensity modulation. A lock-in amplifier was also used. FIG. 3 shows typical results. In the measurements described, an single-photon absorption modulator achieved a response to the gate of 0.6 degree/mW. We used a frequency of 32 MHz, a gate wavelength of 1541 nm, and a signal wavelength of 1550.8 nm to test single-photon absorption modulators with varying arm lengths, frequencies and wavelengths. The extinction on the sinusoidal modulation was around 20%.

We measured the dependence of the device response on the signal wavelength. As shown in FIG. 3, the maximum response occurred at bias points of 90 or −90 degrees. These bias points represent the locations of the maximum response for a phase-modulation-based effect. This is compelling evidence that the single-photon absorption mechanism primarily causes phase modulation, not intensity modulation. Changing the gate wavelength did not lead to a notable change in device performance. This response is as expected, since at no point does the gate mode interfere with itself, nor should the phase of the gate mode affect the signal mode.

FIG. 3 is a diagram showing the results of lock-in amplifier assisted measurements. FIG. 3(a) is a graph showing the device response, in peak to peak intensity of modulated signal, as a function of gate power. The extinction on the gate is about 20%. The signal power reported is the projected average power in the silicon waveguide just before the initial Mach-Zehnder y-junction. FIG. 3(b) is a graph showing the device response in similar circumstances as a function of varying signal power. In both cases, a linear relation is observed. FIG. 3(c) is a graph showing the device response as a function of signal wavelength, as well as the passive transmission through the single-photon absorption modulator of the signal alone. Maximum response is found at 90 and 270 degree bias points, which have 50% signal mode transmission, corresponding to a phase modulation mechanism.

The data shown in FIG. 3 also provide insight into the quantum mechanism behind the all-optical modulation. In particular, a single photon mechanism is suggested. If the modulation were based on a two-photon process, then the increase in peak-to-peak output intensity should be quadratic in increasing gate powers. Note that as in the pseudo-random bit sequence experiments, a filter has been used to selectively view only the signal optical mode.

Frequency Dependence

Figure 4:
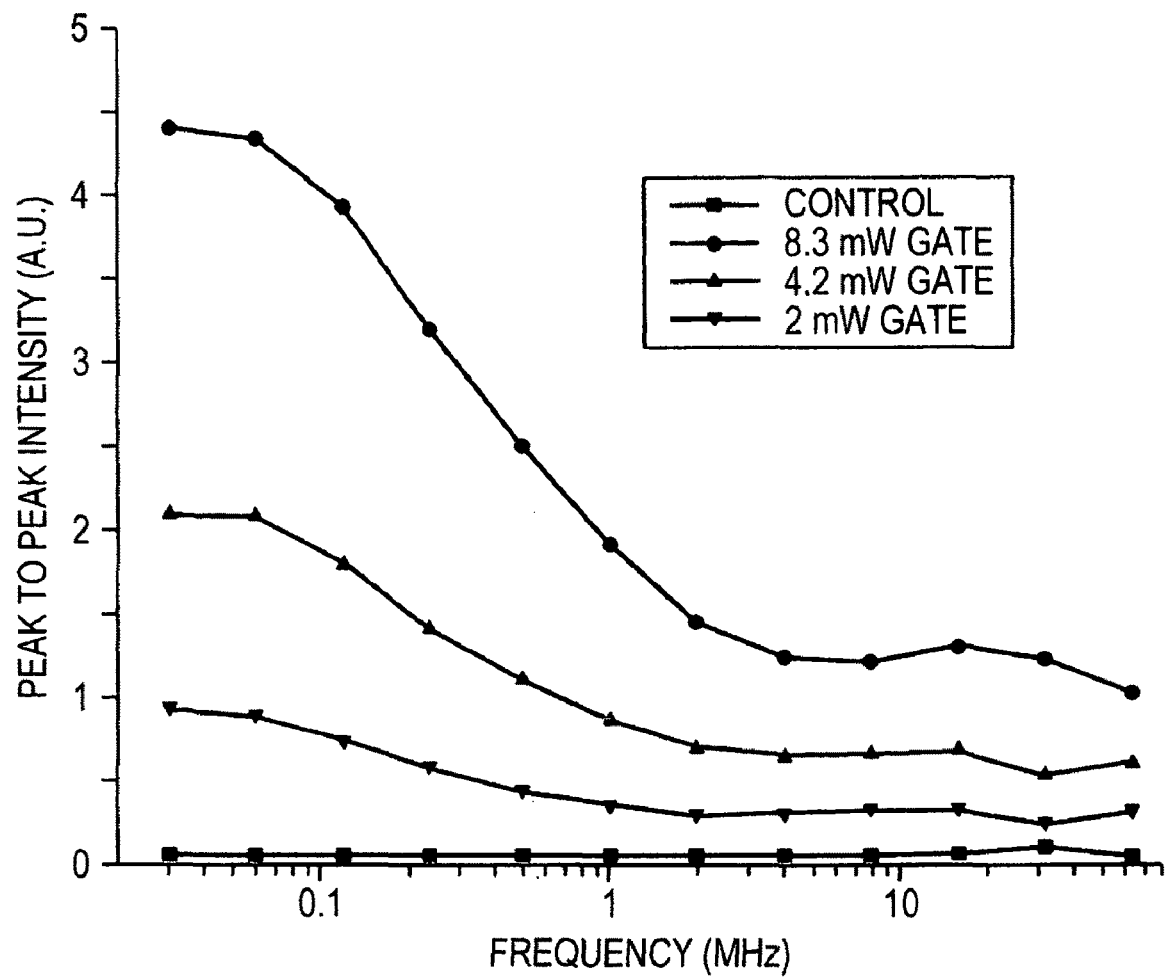
FIG. 4 is a graphical representation of the frequency dependant device response at speeds up to approximately 50 MHz, according to principles of the invention.

The frequency of the sinusoidal gate modulation was varied, and further data was taken to determine the bandwidth of the all-optical modulation mechanism. As before, a lock-in amplifier was used along with a filter to isolate the signal optical mode on the device output. As shown in FIG. 4, data were taken at speeds from 30 KHz to 50 MHz. The device response was fairly flat from 1 to 50 MHz. The peak to peak intensity modulation measured on the output gate mode is shown as a function of gate modulation frequency, for a constant gate power. We surmise that the higher response at slower speeds is likely due to heating.

Figure 5:
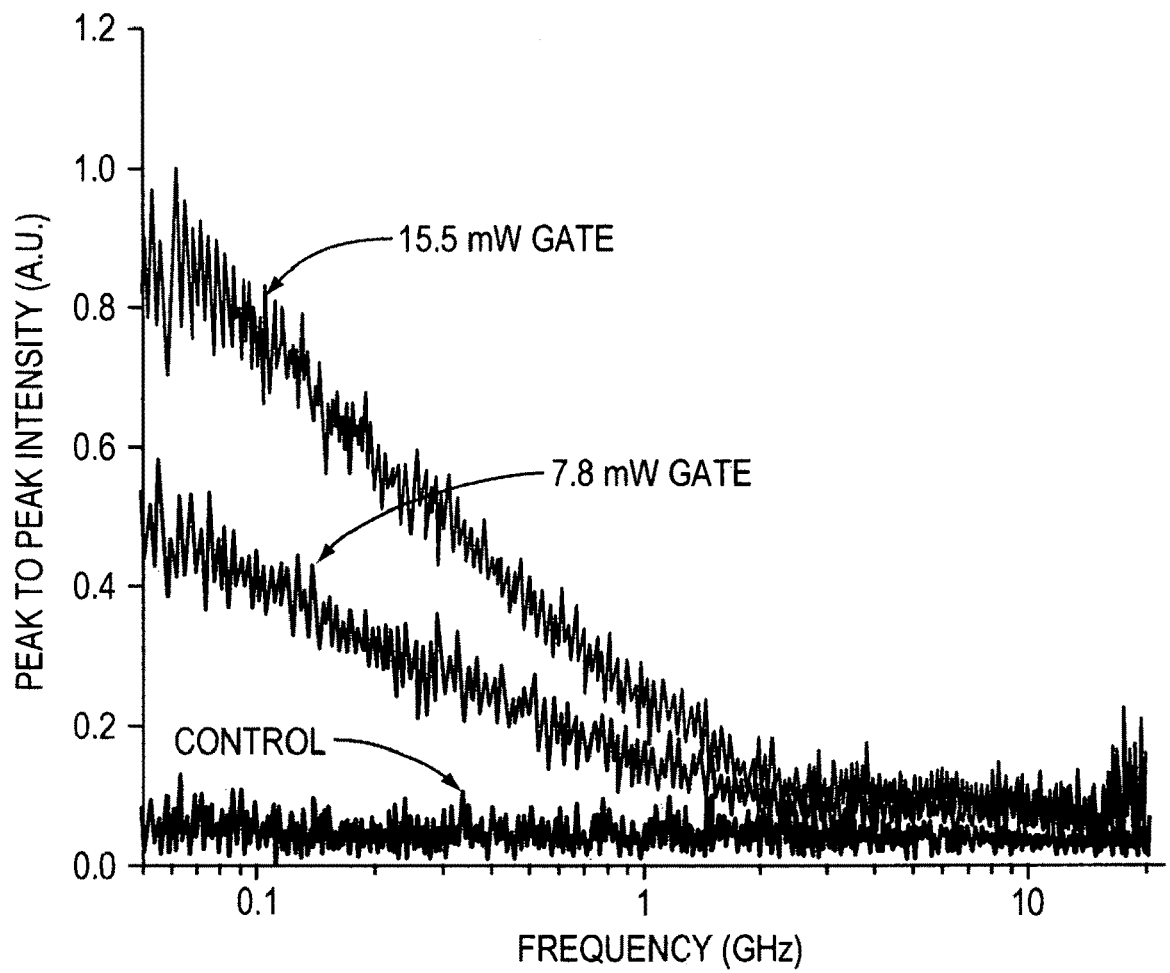
FIG. 5 is a graphical diagram illustrating the high speed frequency response of a single photon absorption modulator device, according to principles of the invention.

Higher speed data were taken by means of a lightwave component analyzer (LCA). In this case, an Agilent 8703B (available from Agilent Technologies, Inc, 5301 Stevens Creek Blvd, Santa Clara Calif. 95051) was used. As before a spectral filter was used to remove the gate mode from the output of the device, ensuring that the LCA measured only the intensity modulation due to the all-optical modulation effect. FIG. 5 shows the results that were obtained. There is clearly a substantial falloff in the device response as the modulation speed approaches 1 GHz. As will be discussed shortly, this is evidence of free-carrier mediation.

FIG. 5 is a graphical diagram illustrating the high speed frequency response of a single photon absorption modulator device. As before, the peak to peak intensity modulation measured on the output gate mode is shown as a function of gate modulation frequency, for a constant gate power. A control is shown in which the signal power was set to zero and the gate to around 15.5 mW, confirming that the gate mode has been filtered out fully.

Testing with a Pulse Stream

To measure the polarity of the mechanism, as well as to observe the performance at slightly higher levels of gate power, measurements were performed in which the gate was pulsed at a repetition rate of 30 MHz and a pulse width of 8 ns. The wavelength was chosen to utilize the arm length difference to bias the Mach-Zehnder offset θ as it appears in Eqn. (1) in the theoretical discussion section. It was found that the polarity of the phase shift was negative; that is, $\partial\phi/\partial P_{gate}$ is negative. Device response of approximately −0.9 degree/mW was observed at a peak gate power of 33.5 mW, for a total phase shift of −30 degrees. A negative index shift is consistent with the effects free carriers, but not the Kerr effect or heating. Details are shown in FIG. 6.

Figure 6:
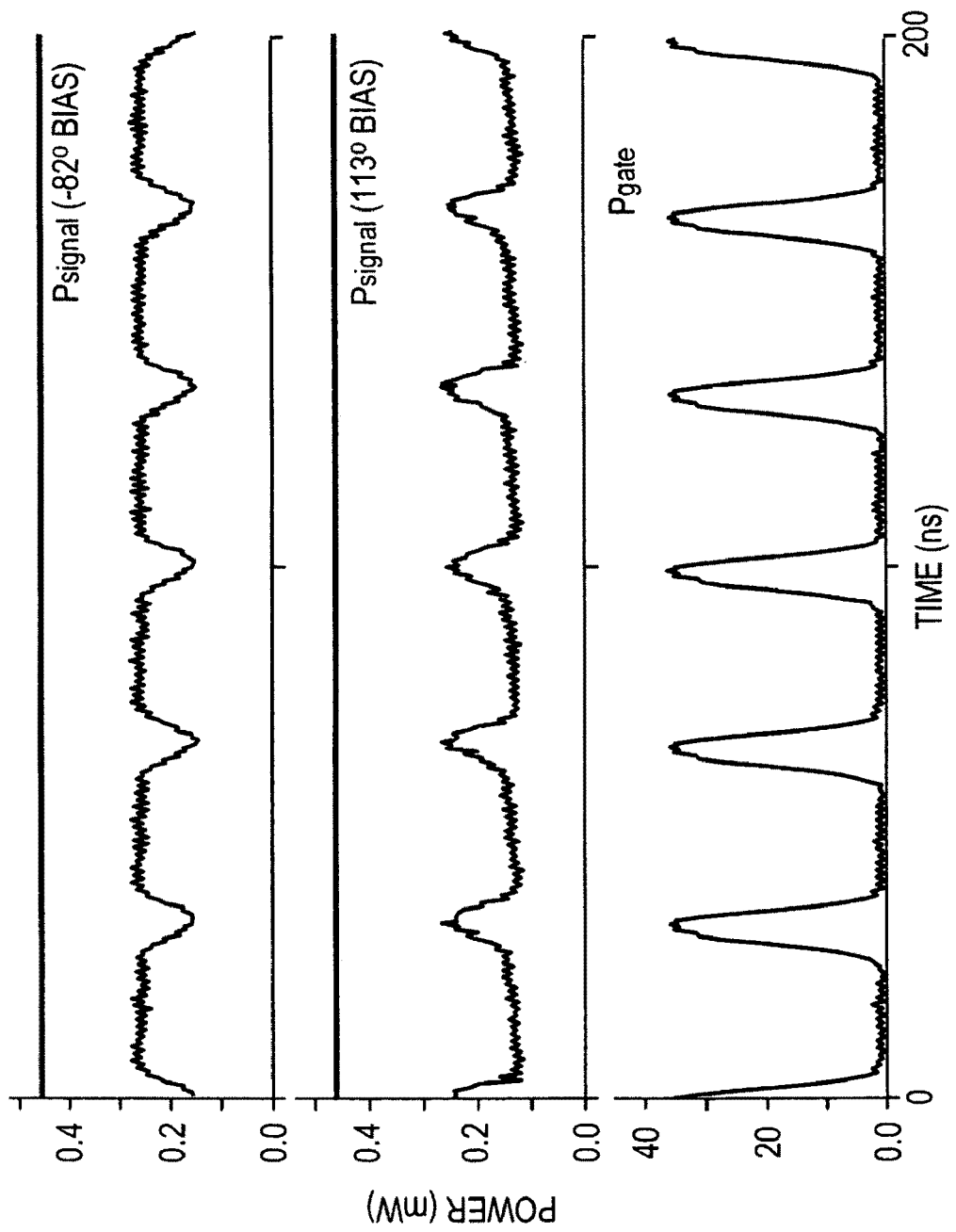
FIG. 6 is a diagram illustrating in graphical form the results of pulsed measurements observed using a single photon absorption modulator, according to principles of the invention.

FIG. 6 is a diagram illustrating in graphical form the results of pulsed measurements observed using a single photon absorption modulator. The projected time domain trace of the gate power is shown in the lowermost curve. The data has been normalized so that the known insertion loss due to the grating couplers has been removed. As a result, the power shown in the upper two traces is the propagating power in the modulation waveguide. The output signal powers are shown for two different bias points, giving two different angular bias points of −82 degrees (uppermost curve) and 113 degrees (middle curve), respectively. In this case, the power reported is the projected power in the silicon waveguide past the final Mach-Zehnder y-junction.

microns. The volume of the 1 μm length of the waveguide is the product of the 1 μm length times the waveguide width times the waveguide depth (or thickness), all measured in units of microns. Table 1 lists several prior art wave guide dimensions as well as the dimensions used in an embodiment of a single photon absorption device described herein. The waveguide cross sections are taken to be rectangular. As may be seen from Table 1, the surface to volume ratio for the waveguides we describe is substantially greater than either of the surface to volume ratios of the prior art waveguides of others. This is a consequence of the smaller dimensions we use for the waveguides described herein, as compared to the prior art waveguides. The surface to volume ratio we used in this work is computed to be 24 $\mu m^{-1}$. The results in Table 1 suggest that a surface to volume ratio is the range of 18 $\mu m^{-1}$ or more would appear to be useful in providing silicon waveguide-based systems that exhibit single photon absorption. We expect that surface to volume ratios of 19 $\mu m^{-1}$, 20 $\mu m^{-1}$, 21 $\mu m^{-1}$, 22 $\mu m^{-1}$, and 23 $\mu m^{-1}$ would also be effective. Various waveguide dimensions, as shown in Table 1 as hypothesized examples, can provide such surface to volume ratios. Based on this analysis, we expect that waveguides of even smaller dimensions will have still larger surface to volume ratios that 24 $\mu m^{-1}$, and should be expected to exhibit single photon absorption behavior as well. This analysis does not take into consideration that oxides are known to passivate surface defects in silicon, and therefore, the surface of the waveguide contacting the silicon oxide layer might be omitted in other calculations.

TABLE 1

| Reference | Length (μm) | Width (μm) | Depth (μm) | Surface Area $(\mu m)^2$ | Volume $(\mu m)^3$ | Surface/Volume Ratio $(\mu m)^{-1}$ |
|---|---|---|---|---|---|---|
| Prior art | 1 | 2 | 0.9 | 5.8 | 1.8 | 3.222222 |
| Prior art | 1 | 0.45 | 0.25 | 1.4 | 0.1125 | 12.44444 |
| This work | 1 | 0.5 | 0.1 | 1.2 | 0.05 | 24 |
| This work-hypothesis | 1 | 1 | 0.125 | 2.25 | 0.125 | 18 |
| This work-hypothesis | 1 | 0.6 | 0.125 | 1.45 | 0.075 | 19.33333 |
| This work-hypothesis | 1 | 0.5 | 0.125 | 1.25 | 0.0625 | 20 |
| This work-hypothesis | 1 | 0.5 | 0.11 | 1.22 | 0.055 | 22.18182 |
| This work-hypothesis | 1 | 0.1 | 0.1 | 0.4 | 0.01 | 40 |

Calculation of Waveguide Surface to Volume Ratio

We have indicated that the devices fabricated in silicon described herein use surface-state absorption involving defects in the surfaces of the waveguide. There are other possible mechanisms for causing single-photon absorption to occur, including damage to the volume of the silicon waveguide, for example by implanting ions in the silicon. Therefore, it is reasonable to consider the surface to volume ratio of waveguides as described herein, in order to evaluate which waveguides might be better suited to operate in the single-photon absorption mode using surface defects. In order to calculate the relative surface to volume ratios of various configurations of waveguides, we will take a 1 micron length of the waveguide as a unit of length, because the other dimensions that we consider are given in microns as well. The surface area of the 1 μm length of waveguide is computed as the sum of the products of the 1 μm length multiplied by each of the surface dimensions (top width, bottom width, and each of the side depths or thicknesses), all measured in units of Construction of an Operational Device We will now describe how an operational device, such as a single "optical transistor," can be constructed. Using the devices described with regard to FIG. 2 as a starting point, one can substitute a digital signal generator, such as an electrical digital signal generator, for the electrical pseudorandom binary sequence generator, so that the signal applied to the gate is a signal having a desired value. One can apply an optical signal to be modulated as an input signal to the input port of the device using a laser with an amplifier such an EDFA as may be required. One can detect the output at the output gate using a filter as may be required or desired, and using a photodetector that provides an electrical signal representative of the optical output signal. In building a more complex device, such as a logic gate, a memory element, or other optical signal processing circuitry, one can cascade more than one device, using the output signal of one device as the input to a gate on another device, or using the output signal of one device as an input (possibly in combination with the output from a second device) as input to the input port of another device. Circuits can be constructed by analogy to known digital or analog circuit designs that use electrical transistors as elements, and which operate using similar logical rules and procedures. By analogy to electrical circuits, in which reference voltages such as various supply voltages and/or ground potential are commonly used, optical systems can use optical signals having predefined characteristics, such as defined frequency and intensity (or power), as reference signals. As will be appreciated, all components that require electrical power to operate (e.g., laser sources, electrical signal generators, an electrical detector or analyzer configured to receive the output of a photodetector, and so forth) can be powered using conventional power supplies, which draw power from conventional electrical power distribution systems (e.g., wall sockets), or from portable electric power supplies, such as batteries. While the structure described herein is a Mach-Zehnder configuration, other configurations for modulators using waveguides are also known, and it is expected that such other configurations may be equally useful in constructing optical modulators that operate in the single-photon absorption regime. Examples of other configurations include ring resonators and photonic crystal or periodic Bragg-grating-based waveguide structures. Optical resonator configurations such as these have the potential to enhance the device response to a given number of single-photon absorption-generated free carriers.

The lack of a low power optical switch, the optical equivalent of a transistor, is one reason that an all-optical computer has not yet been developed. One might consider building an optical computation device using a plurality of single-photon absorption based switches. One approach would be to use the single-photon absorption switch to construct the optical equivalent of a flip-flop; that is, a device that has two stable states, which can encode a 1 or a 0. Another possibility is to use single-photon absorption switching regions on two arms of a Mach-Zehnder interferometer, which could be used to construct an AND gate. Because these elements would be relatively low in power for a well-designed single-photon absorption switch, it is expected that one could construct many of them in close proximity, allowing the creation of extremely fast and powerful computation engines.

In general, a logic gate or logic element built using the single-photon absorption based methods described would implement a logic function as follows. One would define a state of the input optical signal and a state of the gate signal. The modulator configured to implement the desired logic function would provide at its output an optical signal that represents the desired logic function as a state of the output signal relative to the state of said input signal. For example, an inverter would provide an output signal having the inverted value of the input signal (e.g., input is "0" or "low" or "false", output is "1" or "high" or "true"). As mentioned, using two input gates, one in each arm of a balanced Mach-Zehnder, might be used to sum two signal, or with the addition of an inverter, or of a gate that introduces a 180 degree modulation, to obtain the difference between two signals.

Distinguishing Single-Photon Absorption (SPA) Based Devices from Two-Photon Absorption (TPA) Devices It is expected that it will be possible to distinguish by observation whether a device is based on a single-photon absorption or two-photon absorption mechanism, for example based on the device response to the gate optical mode strength. A device based on a single-photon absorption mechanism will be expected to continue to have a linear response to the gate optical mode strength, while the response from the two-photon absorption device will be quadratic. By way of example, consider the small-signal response for a device that is characterized in terms of 10 degrees of response for a certain amount of gate power. If the power is now reduced by a factor of 100, a single-photon absorption based device will now have a response of 0.1 degrees, but a two-photon absorption based device will now have a response of 0.001 degrees. As a practical matter, this means that for smaller powers the single-photon absorption device will continue to function, but at a certain point the two-photon absorption device will practically cease to respond to the gate optical mode. At very high powers, for particularly efficient devices, another data point can be used. The two-photon absorption based device will always have a quantum efficiency in terms of switching electrons and holes that is around one-half that of the single-photon absorption based device. While gain due to avalanche processes or some other intermediate step may obscure this somewhat, it should still be possible to determine which mechanism is operative based on the operational limitations and/or response as a function of input power on device performance.

All-Silicon Photodetector

Silicon is an extremely attractive material platform for integrated optics at telecommunications wavelengths, particularly for integration with CMOS circuits. Low loss waveguides, high-Q resonators, high speed modulators, efficient couplers, and optically pumped lasers have all been demonstrated. Developing detectors and electrically pumped lasers at telecom wavelengths are the two main technological hurdles before silicon can become a comprehensive platform for integrated optics.

Silicon's bandgap of 1.12 eV makes it challenging to build a silicon-based detector in the near infrared. Silicon has minimal absorption of photons in this regime, at least in the bulk, defect-free case. Two-photon absorption can potentially be used to circumvent this limit and build a detector, but for practical power levels the efficiency is poor. Approaches to detection have typically relied upon bonded III-V materials, on integrating Germanium or use of SiGe alloy materials, or more recently, through volume defect creation via ion implantation.

A photocurrent has also been observed in undamaged silicon waveguides, and has been attributed to an effect from the surface of the waveguide, though quantum efficiencies of only 0.24% were shown. Here we show a single photon photodetector based on surface states of a SOI ridge waveguide. Because of the large modal overlap with the surface of the waveguide for our particular geometry, photons are more efficiently absorbed, and a quantum efficiency of 2.8% is obtained. It is expected that there can be many different mechanisms that might provide single photon absorption in addition to surface state effects and bulk defects such as those created by ion implantation, including such mechanisms as different types of damage to the silicon material, use of different ion implant species, and use of other kinds of materials such as germanium, tin, and alloys thereof, III/V materials and alloys thereof, bonded materials, epitaxially grown materials, deposited materials, quantum dots, organic optically active materials, and others. The electrical, optical and crystallographic characteristics of such materials can be modified or adjusted by incorporating dopants therein, It is also expected that one can add one or more semiconductor junctions (such as a p-n junction, a p-i-n junction, or other types of junctions) or an electrical gate to such types of structures, in order to provide a device that can also provide electrical amplification.

It is anticipated that resonant enhancement may also be utilized in order to enhance the performance of these devices, either by substituting a resonator for the Mach-Zehnder interferometer (in order to create a resonantly enhanced device, rather than one relying on traveling waves), or by combining a resonator with the interferometer.

Waveguide Geometry

It is well known that defect states can form at the edge of a crystalline semiconductor. Such defects are known to contribute substantially to the optical losses of silicon waveguides. Most low-loss silicon waveguide geometries involve fairly large silicon waveguides, on the scale of at least 0.450 µm×0.250 µm, and often more than 2 µm×0.9 µm. We instead use a geometry of 0.5 µm×0.1 µm, obtaining losses of around 5 dB/cm. FIG. 1(a) through FIG. 1(e) show diagrams of the waveguide geometry used, as well as information on the mode distribution and SEM micrographs of the waveguide.

Figure 1D:
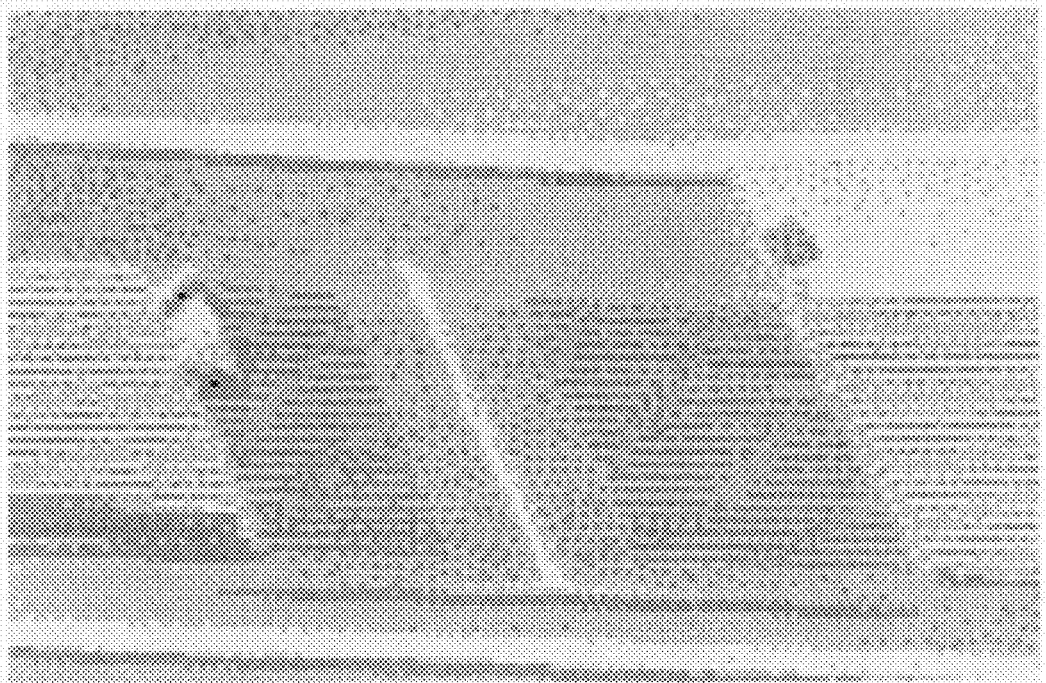
Figure 1E:
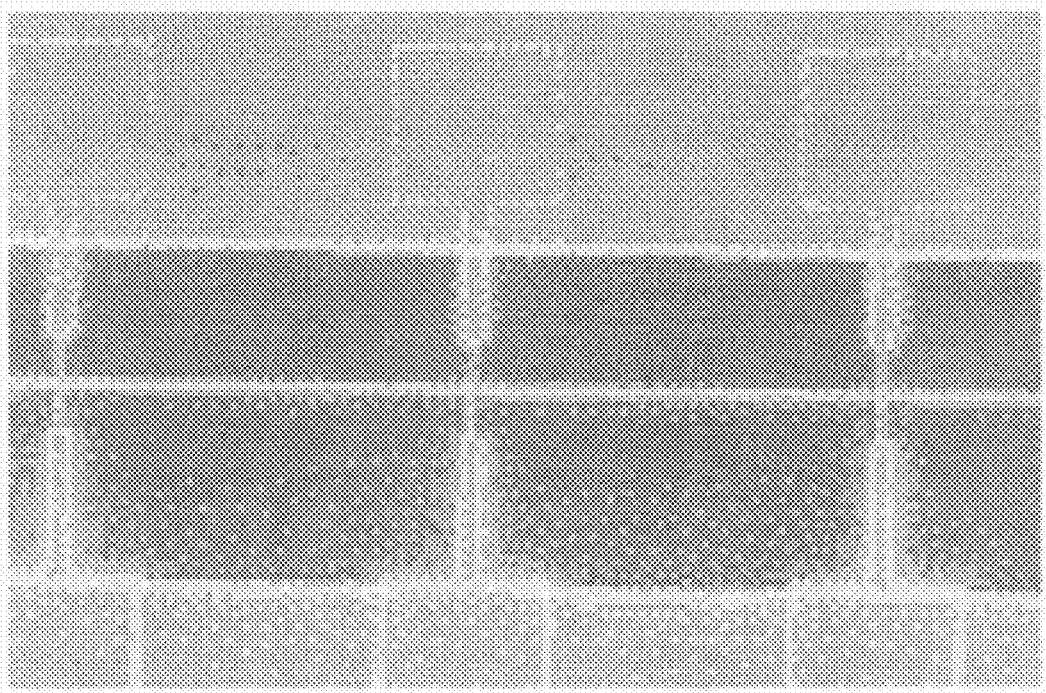

In FIG. 1(a) the modal pattern for the TE-1 mode is illustrated overlaid on a drawing of the waveguide. Contours are drawn in |E| in increments of 10% of max value. For a propagating power of 1 W, the peak electric field will be about $10^8$ V/m. In FIG. 1(d) there is shown an SEM micrograph of a detector device of type B, as defined herein below. In FIG. 1(e) there is shown another SEM micrograph of a device of type B. A ridge waveguide is contacted by a series of tiny, conductive arms. The optical mode is tightly confined to the ridge waveguide, and does not appreciably touch the metal pads or the surrounding silicon layer.

Polymers, oxides or air can be used as claddings. Loss comes primarily from three effects: scattering from residual lithographic roughness, absorption from surface states, and absorption from the bulk silicon. These surface states exist precisely where the optical mode field of the waveguide is at its peak intensity, because the electric field is normal to a high dielectric discontinuity. A grating coupler was used to couple light from a standard fiber optic mode pattern into the ridge waveguide.

Device Fabrication

Devices were fabricated in electronics-grade SOI from Soitec, doped at around $10^{15}$ dopants (Boron)/cm$^3$. No implant or irradiation is performed on the silicon material. The starting material was oxidation thinned to about 110 nm by dry oxidation, singulated into small chips, and patterned using electron-beam lithography on a 100 kV electron beam writer using HSQ resist. The samples were etched with chlorine in an inductively coupled plasma etcher. After removing the residual resist and native oxide, photolithography and evaporation were used to define and deposit aluminum electrodes. No cladding layer was deposited for all devices.

Electrical Measurements

Device Layout

The most straightforward way of observing the photocurrent effect is to electrically contact the optically active area, and apply a bias voltage. The surface state absorption will change the conductivity of the device, and this will result in a photocurrent. Two device types were studied: in type A, the grating couplers were contacted directly with large silicon arms. In type B, small silicon arms can be used to form contacts to the waveguide directly; only around 0.2 dB of optical insertion loss is endured from 0.07 um silicon arms. These two device layouts are shown in FIG. 8(a) and FIG. 8(b). FIG. 8(a) is a diagram illustrating a detector of type A. The photoconduction region comprises the loop of the ridge waveguide, while the grating couplers are connected to the metal electrodes. FIG. 8(b) is a diagram illustrating a detector of type B. Here the photoconduction region is the intersection of the conduction arms and the waveguide. FIG. 8(c) is a diagram illustrating an equivalent circuit, with Rp the photoconductive resistor, and Rm the resistance of the measuring apparatus. The diodes present in the circuit are due to the metal-semiconductor interface. Device type A had a length of 0.4 mm, while device type B had a length of 1.5 mm, and 40 contacting arms. In both cases, light flows into one grating coupler, through the electrically contacted ridge waveguide, and finally out through another grating coupler. SEM micrographs of devices of type B are shown in FIG. 1(d) and FIG. 1(e).

It is important to note that the optical field is separated by tens of microns from the region where the metal pads touch the silicon for both devices. No propagating mode is supported along the tiny conductive arms, and the insertion loss due to, each arm is minimal, as confirmed by both simulation and measurement. This is significant, as a Schottky barrier can result in a photocurrent for near infrared radiation on the basis of internal photoemission. If the optical mode did touch the metal-silicon barrier, this could be a possible source of the photocurrent that is observed, but the geometry used excludes this possibility.

DC I-V Measurements

The devices were first characterized by coupling a continuous wave laser at 1575 nm through the input coupler, and measuring the DC current that flowed in response to a series of voltages. Several devices were studied, a device of type A (A1) and of two of type B (B1, B2). FIG. 8(d) is a diagram illustrating the entire experimental setup. For DC I-V curves, the lockin is replaced with a picoammeter.

The measured IV curves for the two devices studied are shown in FIG. 9(a) and FIG. 9(b). FIG. 9(a) is a graph showing DC I-V curves for device A1. FIG. 9(b) is a graph showing DC I-V curves for device B1. The propagating power shown is the power in the waveguide after the loss due to the grating coupler and other parts of the optical test apparatus. For the data shown, input light at 1575 nm was used. In the case with no incident radiation, the data show the effect of the rectifying contact created by an aluminum electrode on top of lightly p-type silicon. This rectification limits device performance, and decreases the quantum efficiency as a result. Ohmic contacts can easily be formed in future devices with contact doping and annealing. By constraining a heavy p-doping to the pad region only, it should be possible to minimize rectifying behavior, while leave optical behavior unchanged.

The power of the test laser used, as well as the propagating laser power in each device is labeled. Slightly different optical paths used in each series of tests result in different levels of propagating power for the same laser power. Current in nA is plotted against voltage in V. Note that FIG. 9(a) shows significantly more rectifying behavior, because there are only two small contacts to the waveguide in this case, while in FIG. 9(b) there were 40 contacts to the guide. FIG. 9(c) is a graph showing the peak to peak output photocurrent of device B2 as a function of frequency. There is minimal change in performance from DC to approximately 60 MHz, where testing was stopped due to limitations of the noise environment where the devices were being tested.

When light is incident on the waveguide, a photocurrent is observed when the device is under bias. The current across the device increases along with the laser intensity. For high power, the device response is not linear in laser power, but shows sub-linear behavior. This is attributable to the rectifying contact in series with the photoconductor. In the best case for device A1, the direct current responsivity at an 11 V bias is 0.1 mA/W, while for device B1 the responsivity in the best case is 1.5 mA/W, corresponding to a quantum efficiency of 0.12%. One of the reasons that device B1's performance is superior is that it has far more semiconductor-metal contacts, allowing more current to flow. It is also possible that the tiny arms connecting the waveguide to the electrodes present additional surface states where optical absorption can occur. Finally, it can be shown that excess electrons and holes can only be cleared from a small portion, around 10 μm of waveguide, from device A1. Therefore, devices of type A had much smaller effective lengths than devices of type B. Device B1 was also measured at lower input powers, where performance improved, and the device response became linear.

Device B2 was measured at higher powers by using an Erbium-Doped Fiber Amplifier (EDFA), with around 10 mW of power propagating in the waveguide. A lockin was also used to precisely measure the output current, as shown in FIG. 9(c). A responsivity of 0.12 mA/W at 7 MHz was obtained, with nearly flat performance in frequency. From 1 KHz to 60 MHz, the responsivity changes by only a factor of 3. The slight nonuniformity seen is likely due to electronic parasitics, and perhaps the testing environment. At lower frequencies, the larger increase in response from DC to 1 kHz is likely due to some sort of parasitic capacitive coupling in the metal-semiconductor contact. We believe that the device would continue to perform past 60 MHz, however environmental noise precludes measurements at these higher speeds. The decreased responsivity compared to the results observed for B1 is believed to be due to the large amounts of power used in testing at high frequencies. It should be pointed out that the photocurrent from the two controls listed in FIG. 9(c) dramatically increases at higher frequencies. This is believed to be a result of increasing radiative cross talk between the lockin and the function generator at higher frequencies.

It is believed that the effect involved is extremely fast, and it is likely that with proper supporting electronics, a detector with speeds in the gigahertz could be constructed. The ultimate limit of the device is believed to be the time it takes to sweep free carriers across a micron scale silicon device. This speed can easily exceed 10 GHz. It is believed that defect absorption centers in silicon can have extremely rapid response times. These measurements were also performed with similar devices that were clad in PMMA, rather than exposed to the atmosphere. A similar level of photocurrent was observed, with very similar performance.

Low Intensity Measurements

It was observed that for larger optical intensities, the dependence of the photocurrent was sublinear, in that doubling the optical input intensity resulted in less than a twofold increase in photocurrent. To better understand the photocurrent process, as well as to estimate the performance in the absence of a rectifying contact, a Princeton Research 5210 lock-in amplifier was used to characterize the photocurrent as a function of optical power. A time constant of 3 s was used for an excitation frequency of 1 KHz, and an input wavelength of 1575 nm. A lithium niobate optical modulator was used to impose a sinusoidal variation on the input intensity, producing a sinusoidally varying photocurrent. The incoming intensity wave is chosen to have nearly full extinction at its lowest point, implying the average power is roughly half of the peak to peak power swing. FIG. 10(a) shows the photocurrent as a function of power for several bias voltages. These measurements were taken for device B1. In FIG. 10(a), the peak to peak photocurrent in nA is reported as well as the peak to peak optical power in the waveguide in mW. The response that would be observed with a perfectly linear 1.5 mA/W and 36 mA/W detector are also shown. The responsivity is seen to continue to improve for lower optical powers, eventually becoming linear. This effect is readily explained by the presence of a reverse biased diode, the character of which is seen in the DC curves in FIG. 9(a) and FIG. 9(b). In the best case, a linear responsivity of 36 mA/W is obtained, corresponding to a quantum efficiency of 2.8% for an 11 V bias. It is worth noting that for higher optical power levels, the responsivity observed with DC measurements is approached. FIG. 10(b) is a graph showing the photocurrent in peak to peak nA of the device for a 11 V bias voltages and several peak to peak laser powers as a function of frequency up to 1 MHz. In both FIG. 10(a) and FIG. 10(b), a logarithmic plot has been used.

We believe that in the future, more optimal electrode and device geometries will enable the device to demonstrate linear responsivity at much higher optical powers. This could be achieved on the basis of doping the silicon to increase the conductivity, and by pad implants to decrease the contact resistance.

Optoelectronic Transistor

It is recognized that a significant accomplishment in nonlinear optics would be to provide full all-optical logic. For a system to be practical, it preferably should be compact, scaled to fit on a substrate sized comparably to a semiconductor chip, operate using relatively low intensity continuous-wave optical power, and permit each element to be operated or pumped by a different element in an array of diode lasers. In a preferred embodiment, the optical pumps will be situated on-chip. In some embodiments, the pumps can be expected to comprise wafer-bonded devices comprising III/N compound materials or their alloys.

It is expected that it will be possible to build a free-carrier based all-optical logic platform for 10-100 GHz applications. Some applications that can be envisioned include devices and systems that provide optical signal amplification, wavelength conversion to or from arbitrary optical wavelengths, regeneration, clock (or frequency) generation in the optical domain, analog signal processing, high-bandwidth packet multiplexing and demultiplexing, delay lines providing arbitrary delays, optical memory, and many other things that are done today with electronic transistors, except that the functions can be done in an all-optical system.

By employing the single-photon absorption effects which have been described herein that are operative in silicon waveguides, one can combine optical inputs and outputs with electronic gain to create an optoelectronic transistor. It is understood that electronic junctions are very good for providing gain, especially through avalanche processes. As one example, it is possible to make integrated photodetectors at 1550 nm with these effects.

Figure 12:
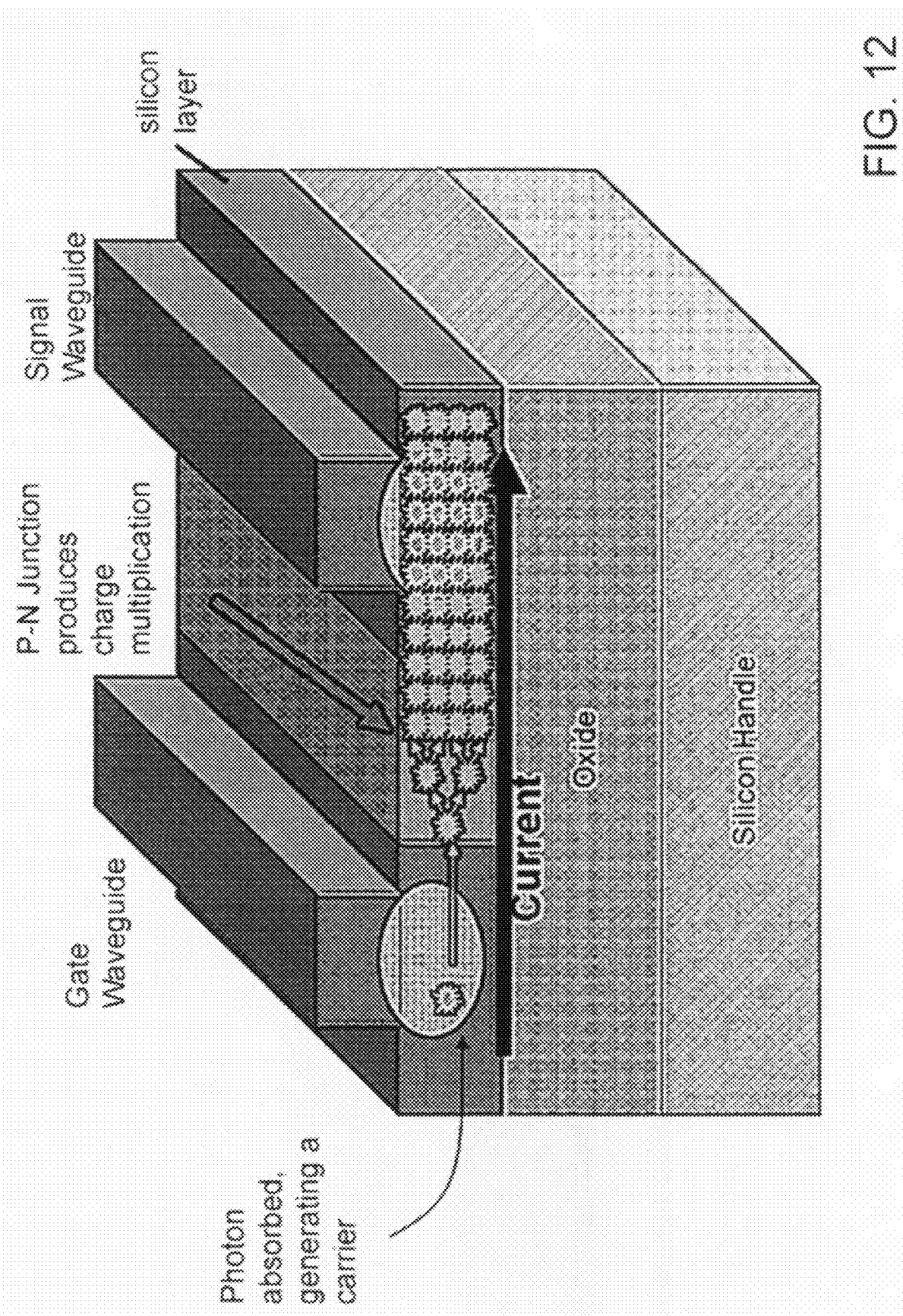
FIG. 12 is a diagram in perspective illustrating the structure and operation of a portion of an all-optical transistor.

FIG. 12 is a diagram in perspective illustrating the structure and operation of a portion of an all-optical transistor. The all-optical transistor can be expected to operate as follows. Light comes in on a 'gate' waveguide and a 'signal' waveguide. Photons from the gate waveguide are absorbed through a single-photon process. A lateral bias provided by applying a voltage across electrodes on the silicon device sweeps the carriers toward the signal guide. These carriers are multiplied through an avalanche process in the semiconductor. A phase shift is created by this large population of carriers in the signal guide. This phase shift is translated into amplitude modulation by utilizing a Mach-Zehnder interferometer.

Figure 13A:
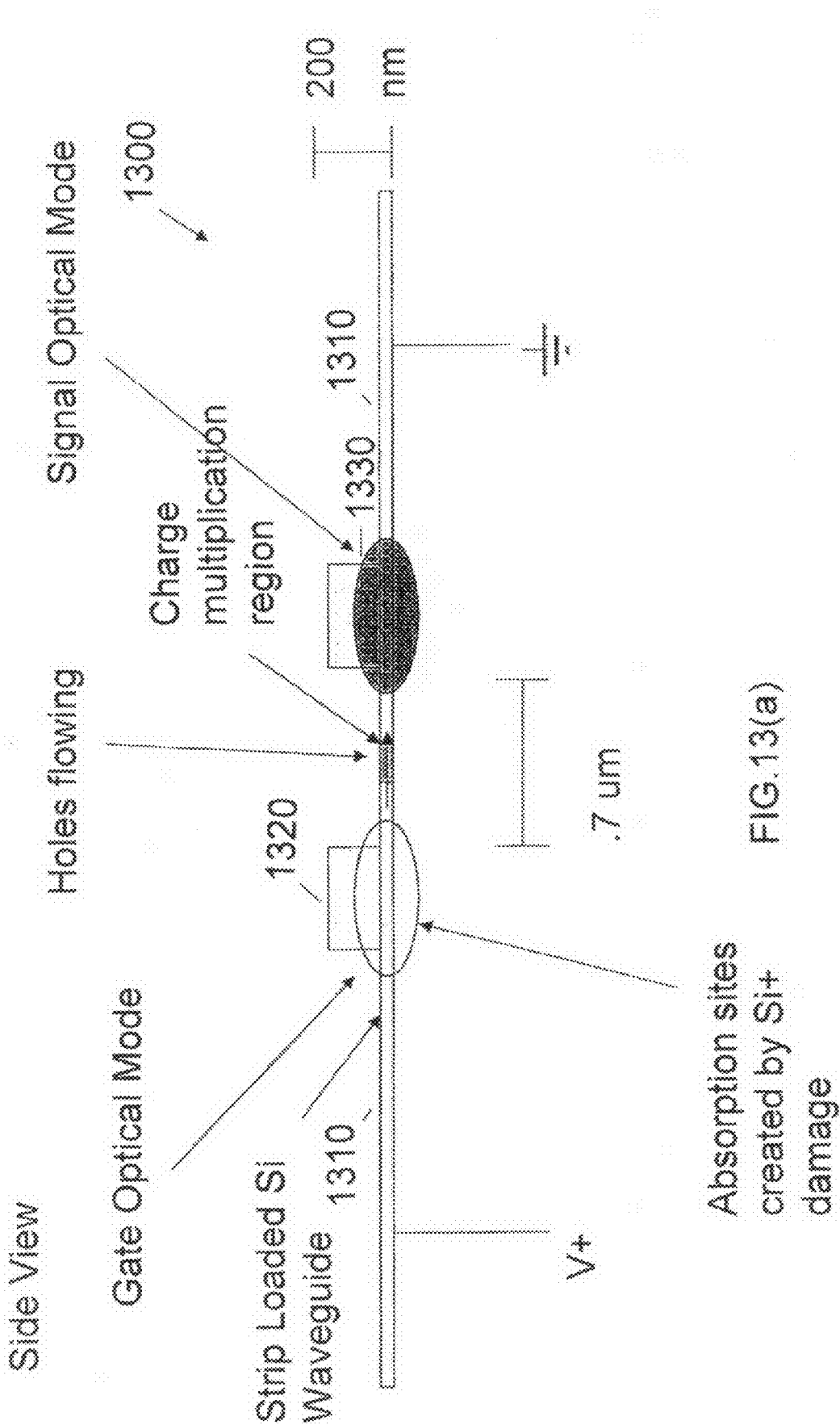
FIG. 13(a) is a diagram in side view of a portion of an illustrative all-optical transistor.

FIG. 13(a) is a diagram 1300 in side view of a portion of an illustrative all-optical transistor. In FIG. 13(a), a structure similar to that of FIG. 12 is described. In the illustrative embodiment of FIG. 13(a), a silicon layer 1310 is provided, which can be, for example a silicon layer of a silicon on insulator (SOI) wafer fabricated on a silicon wafer substrate. The silicon layer 1300 is doped with conventional dopant atoms, such as those from column III of the periodic table (to provide holes, or p-type material) or those from column V of the periodic table (to provide electrons, or n-type material). Silicon optical waveguides 1320 and 1330 are shown end on.

In one embodiment, the two waveguides are separated by a distance of 0.7 μm, and have a thickness or height of approximately 200 nm. The waveguide 1320 can be the gate waveguide, adjacent to which the silicon layer 1310 may have been deliberately damaged, for example by ion implantation with silicon ions. The damaged silicon layer may absorb a photon from the gate waveguide 1320. Under the application of an electrical field across the silicon layer 1310, as illustrated by the connection of a positive voltage V+ on one side of the layer 1310 and the connection of the other side of the layer 1310 to ground potential, the carriers generated are accelerated, and charge multiplication by an avalanche process is caused to occur. The charges so generated affect the optical properties of the signal waveguide 1320, which can be one leg of a Mach-Zehnder interferometer (with the other leg not illustrated in FIG. 13(*a*).

FIG. 13(*b*) is a diagram in plan view of a portion of an illustrative all-optical transistor, such as that of FIG. 12. FIG. 13(*b*) shows the relative placement of the gate waveguide, the signal waveguide, the implant region, and the positions where the voltage signals are expected to be applied to the device. The implant region comprises one or more implanted ionic species, such that the desired (or optimal) p/n distribution will depend on the quantum mechanism operative in the junction region. For comparison, a line representing a distance of 0.7 μm is also shown.

FIG. 13(*c*) is a schematic diagram illustrating the logical layout of an illustrative all-optical transistor. In FIG. 13(*c*) the signal waveguide is one arm of a Mach-Zehnder interferometer, and the gate waveguide provides an input signal that modulates the optical index (e.g., causes a Δn) of the signal waveguide.

Figure 14:
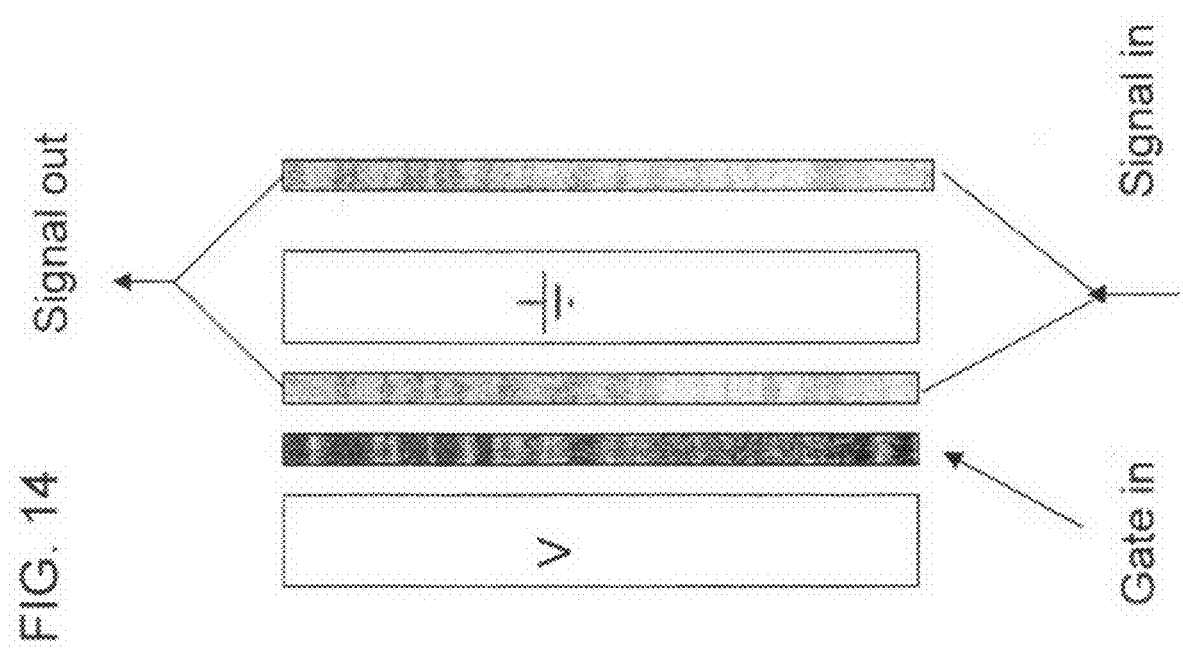
FIG. 14 is a schematic plan diagram showing the layout of an all-optical transistor that comprises a Mach-Zehnder interferometer geometry, in which one arm of the Mach-Zehnder is the signal waveguide of FIG. 13(a) and FIG. 13(b)

FIG. 14 is a schematic plan diagram showing the layout of an all-optical transistor that comprises a Mach-Zehnder interferometer geometry, in which one arm of the Mach-Zehnder is the signal waveguide of FIG. 13(*b*).

Figure 15:
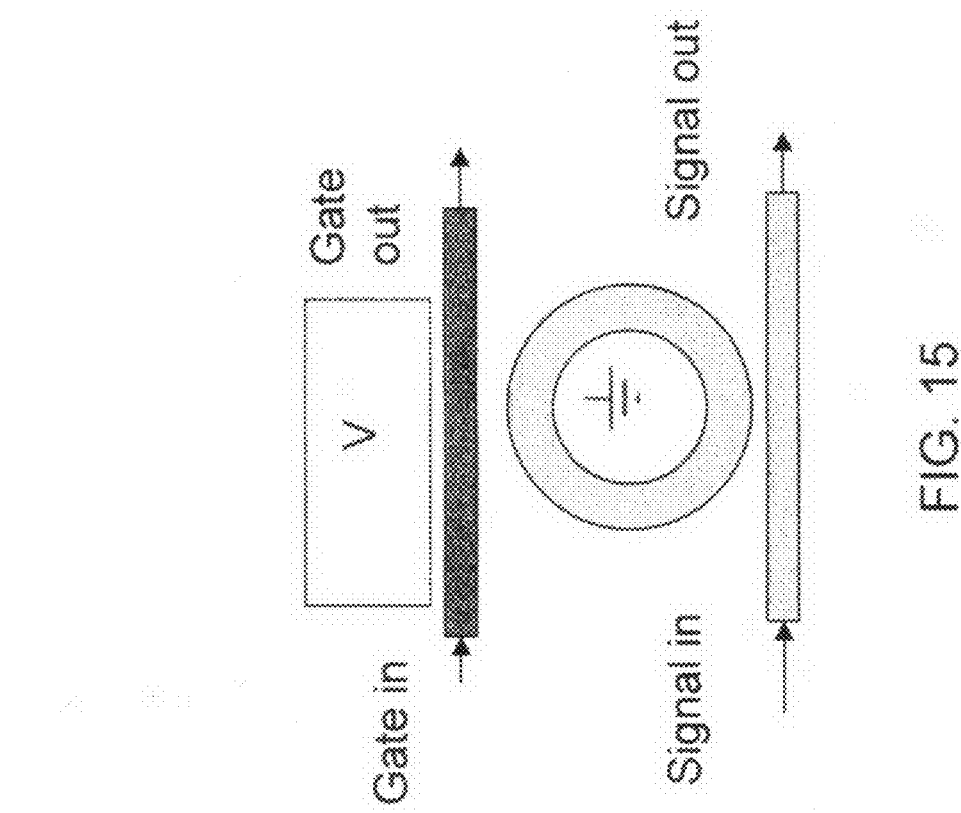
FIG. 15 is a schematic plan diagram showing the layout of an all-optical transistor that comprises a ring resonator geometry.

FIG. 15 is a schematic plan diagram showing the layout of an all-optical transistor that comprises a ring resonator geometry.

The all-optical Mach-Zehnder switch can be envisioned for use as an amplifier, an all-optical logic element, or a nonlinear all-optical signal processing element that could operate at 100 GHz. The operation of the device could be tuned by controlling the DC bias.

It is expected that with a resonantly enhanced device, very low (for example mW scale) gate power could be realized, according to the relation:

$$\frac{\partial \lambda}{\partial P_{gate}} \sim \frac{\lambda_0}{n} \frac{\partial n}{\partial P_{gate}}$$

Some estimates of the performance of such devices can be presented. We have a hole saturation velocity of ~8×10$^6$ cm/s. For a distance of approximately 0.7 μm, it takes only about 9 ps for the charge carriers to make the transit at the saturation velocity. This suggests that a bandwidth in excess of 100 GHz is possible.

We can also consider the responsivity in radians/mW, which will determine how much power will be needed for a desired phase shift, such as 180 degrees or π radians. In radians, Pπ=π/Responsivity, which corresponds to turning the switch totally on or off. This is discussed further elsewhere in this document.

All-Optical Integrated Photonic Clock

It is desirable to create an integrated source for a periodic signal, which is some embodiments can be a square wave, in the optical domain, with low jitter. This can be used for many purposes, including a conversion into the electrical domain to provide a clock signal that can be used as an RF reference signal.

Figure 16:
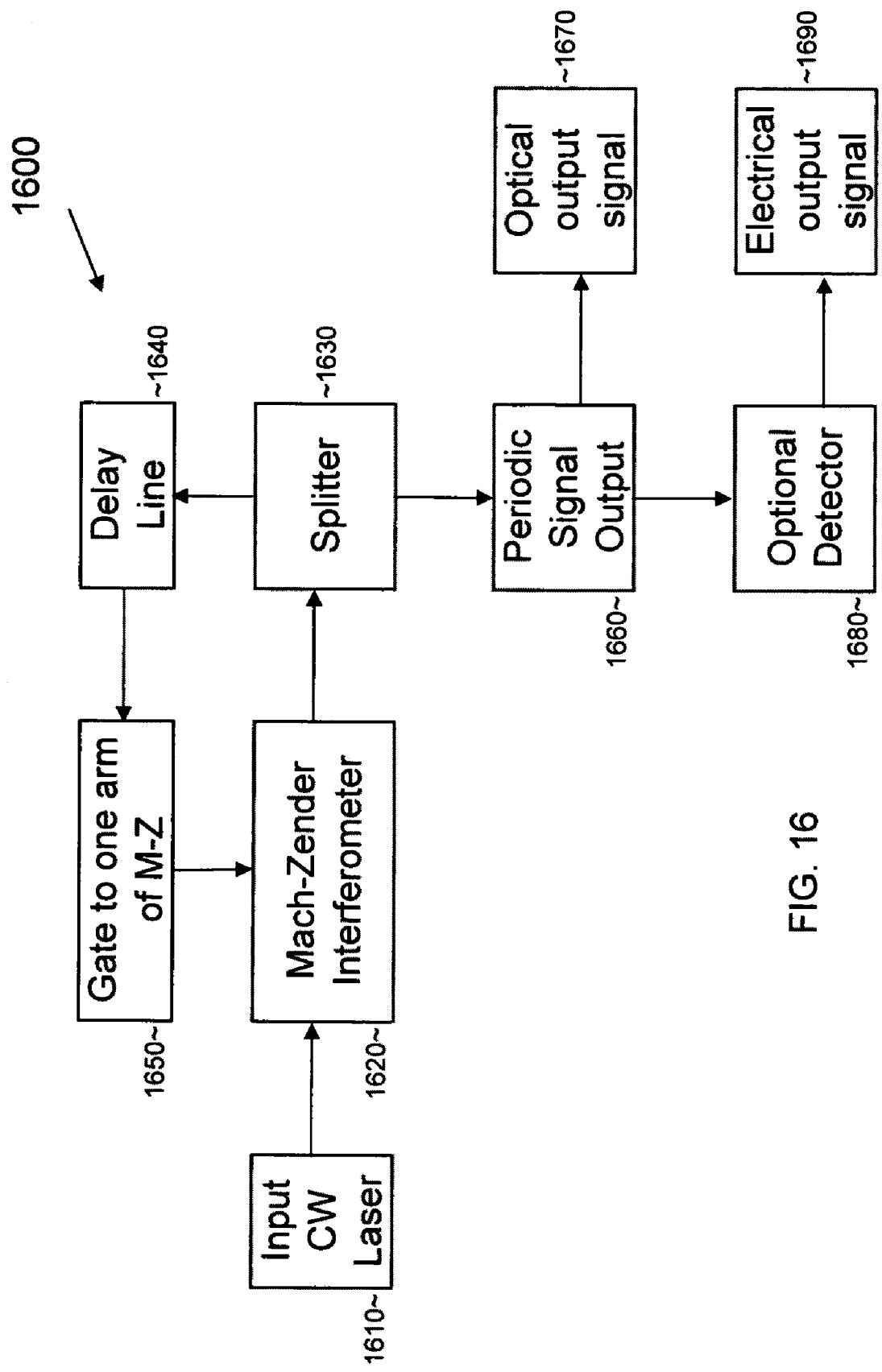
FIG. 16 is a schematic diagram of an all-optical clock according to the present invention.

FIG. 16 is a schematic diagram 1600 of an all-optical clock. This device functions by enabling a gate optical beam to modify the refractive index of an arm of a Mach-Zehnder interferometer or a ring resonator through the generation of free carriers from a single photon absorption (SPA) mechanism. This mechanism can be based on damage from, for example, Si implants, Germanium, or surface states. Because the optical power that is being switched can be increased independently of the gate optical power, optical gain can be realized; a lower power optical signal can switch a higher power signal. This gain can be augmented with an avalanche gain region, for example using an optoelectronic transistor as one arm of the Mach-Zehnder interferometer.

In FIG. 16 a CW laser 1610 is used to provide an input signal for the all-optical clock. The input signal enters the input port of a Mach-Zehnder interferometer 1620. One arm of the Mach-Zehnder comprises a gate 1650 to allow a gate signal to be applied to that arm. The output signal of the Mach-Zehnder goes to a splitter 1630. The splitter 1630 provides a portion of the output signal from the Mach-Zehnder signal to a delay line 1640, and a portion of the output signal from the Mach-Zehnder to a periodic signal output port 1660, from which an optical output signal 1670 can be recovered. Optionally, the periodic signal output port 1660 transmits some portion of the optical output signal to an optical detector 1680, such as a high speed photodetector, which can provide an electrical output signal 1690 that is the electrical equivalent of the optical output signal, provided that the photodetector can operate at sufficiently high frequencies.

The delay line 1640 can be of fixed length, or it can be of variable length. In one embodiment, the delay line is selected to be approximately one centimeter in length, which would corresponds to a delay of approximately 100 ps, corresponding to a 10 GBit/s periodic signal, for example a substantially square wave. As is well known from theoretical considerations, "square wave" signals often include artifacts, and may not be precisely square, but are nevertheless so named. Such device lengths are practical in integrated optical systems. One possibility for selecting a length would be to build the delay line with a series of taps at predefined distances along the length of the delay line. By way of example, the taps could be placed at distances selected to be logarithmic (e.g., distances such as 1 cm or 10 mm total delay line length, and taps at distances corresponding to log 2 mm, log 3 mm, log 5 mm and so forth along the delay line). Alternatively, taps could be placed at distances of 1 mm, 2 mm, 3 mm and so forth along the 10 mm delay line. Each tap would communicate with the gate by way of a modulator, so that a selected delay line could be made operative, and other delay lines could be made inoperative at any specific time of operation. We have described an all-optical clock comprising an all-optical transistor having an input port, an output port and a gate, the all-optical transistor configured to operate in a single photon absorption mode, an output signal of the all optical transistor configured to be directed back to the gate port by way of a delay line, the delay line having a propagation delay, the propagation delay configured to provide a time standard for an oscillation frequency of the all optical transistor.

The overall operation of the clock would be as follows. When the clock is first turned on, there is no gate signal at the first arm of the Mach-Zehnder, and no gate signal at the second arm, for example because no gate is provided on the second arm. The Mach-Zehnder would therefore pass an optical signal that would constructively interfere at the output of the Mach-Zehnder. The splitter would send a portion of that output back to the gate on the first arm of them-Z, with a delay defined by the length of the delay line (or the effective length if taps are used), and by the velocity of light in the medium of the delay line. When the light from the splitter reaches the gate, the arm operated by the gate will undergo a change in its optical properties and the light passing through that arm will undergo a phase change. If the phase change is sufficient (e.g., 180 degrees or pi radians), the output of the Mach-Zehnder will be quenched. This will then turn off the signal to the gate, and the Mach-Zehnder will behave as it did on start-up (e.g., it will pass an optical signal again). The net effect is to provide a square optical output at the output port of the Mach-Zehnder, the on and off periods defined by the delay line characteristics (e.g., length, optical properties, and so forth).

Performance Limitations

The turn-on time will be limited by the turn-on time of the optoelectronic transistor (OET) that forms one arm of the Mach-Zehnder. This could be as short as 10 ps. The other performance limitation will be the fact that a delay line of only a finite length can be used.

Clock Rate Multiplication

In contrast to a clock formed with an RF signal, the optical periodic signal such as a square wave can be mixed with itself to obtain multiplication. The optical signal can be directed through an unbalanced Mach-Zehnder. In one embodiment, the process can be used to obtain a 2× multiplication of the clock rate. Depending on the rise time of the underlying mechanism, this process can potentially be used multiple times to get substantial increase in the clock signal rate.

Figure 17:
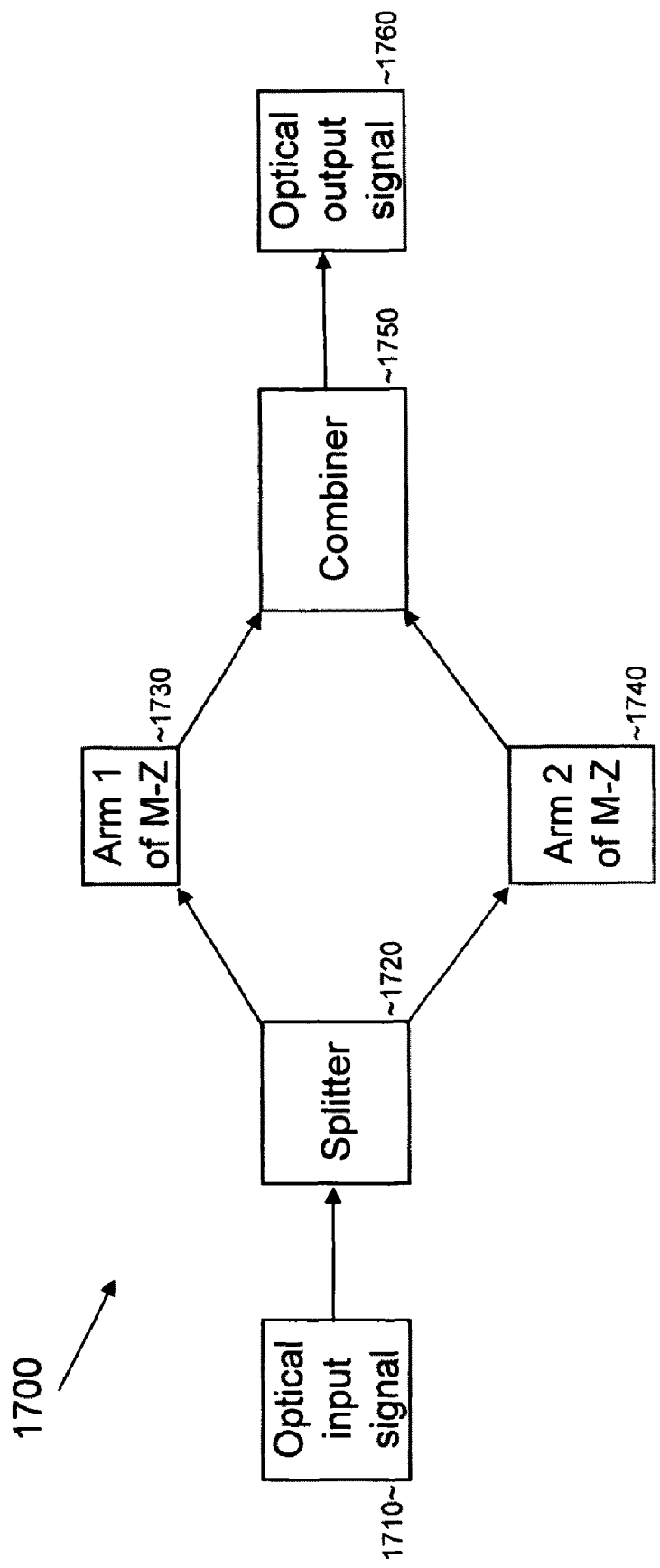
FIG. 17 is a schematic diagram of a clock multiplier based on a Mach-Zehnder modulator.

FIG. 17 is a schematic diagram 1700 of a clock multiplier based on a Mach-Zehnder modulator. In FIG. 17, an optical input signal 1710 having an input clock signal with period 2T, which can be for example an output signal 1670 from the clock of FIG. 16, is applied to a Mach-Zehnder interferometer, in which one arm (for example arm 1730) has a waveguide with length chosen to induce a delay of T/2, and a phase shift of π relative to other arm, 1740. This can on one embodiment be accomplished by passing the optical input signal 1710 through a splitter 1720. The splitter 1720 sends a portion of the optical input signal 1710 to arm 1 of the Mach-Zehnder 1730 and a portion of the optical input signal 1710 to arm 2 of the Mach-Zehnder 1740. A combiner 1750 is provided to allow the two signals from arm 1730 and arm 1740 to combine, and the output of the combination is provided as an output optical signal at optical output signal port 1760.

Theoretical Discussion

Mach-Zehnder Device

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Evidence of Single-Photon Absorption Mechanism

There are a number of possible mechanisms by which one near-infrared optical mode can induce a phase shift in a second near-infrared optical mode in a silicon waveguide. These consist of thermal interaction, the Kerr effect, or free-carrier dispersion, which can be due to two-photon absorption, or in the case of our all-optical modulator, single-photon absorption. Whatever the mechanism, it is possible to express the all-optical interaction as follows:

$$P_{out}=C(1+\cos(\gamma((1+b\cos(\omega t))P_{gate})^\alpha+\theta))P_{signal}^\beta \quad \text{Eqn. (1)}$$

where we have assumed that the gate signal has the form $$(1+b\cos(\omega t))P_{gate} \quad \text{Eqn. (2)}$$

In Eqn. (1), $P_{out}$ is the output power as a function of time of the filtered signal optical mode, and γ and C are proportionality constants characteristic of the interaction. We have also assumed the signal is at a speed far below the bandwidth limit of the relevant effect. If the modulator is biased at the point of maximal response, that is, choosing 0 to be ±π/2, then the peak to peak intensity modulation on the output will be proportional to $$R \propto 2\gamma b^\alpha P_{gate}^\alpha P_{signal}^\beta \quad \text{Eqn. (3)}$$

if the modulation effect produces much less than π/2 radians of phase shift. In all of the experiments described herein, except where explicitly noted otherwise, the modulator bias was always set to this value. It was easy to do this, because far less than π/2 radians of shift was achieved in even the highest gate power cases, and so this amounted to simply tuning the signal wavelength to maximize the device response. In the case of a linear modulation mechanism, that is, where α and β are both 1, γ can be identified as $\partial\phi/\partial P_{gate}$.

Other than single photon absorption, the mechanisms that exhibit this power law are two photon absorption-based absorption modulation, the Kerr effect, and Raman scattering. In all three cases, however, there exists no bandwidth limitation near 1 GHz. Of these effects, a phase shift would be observed for only the Kerr effect. Moreover, Raman scattering must involve wavelengths separated by the Raman shift—15.6 THz in silicon—which is clearly irrelevant to the current result. As shown in table I, the observed gate response is also more than an order of magnitude larger than what would be achievable with any mechanism other than single photon absorption, even in an idealized case. Single-photon absorption is the only mechanism consistent with the observed data.

The lower gate responses of other modulation mechanisms result in typical effective $P_\pi$ values from 5 Watts, to 100 Watts. The high modulation power requires most other devices to be operated in pulsed mode. Even when resonant enhancement is used to greatly lower the external power required, the internal circulating power must still be quite high. By contrast, our single photon absorption based device can be projected to achieve complete extinction at around 180 mW $P_\pi$, over an order of magnitude lower than is achieved with existing mechanisms. No further resonant enhancement would be required. Furthermore, silicon nano-waveguides can carry bit streams with average power levels in the tens and hundreds of milli-Watts. However, multi-Watt average power levels will rapidly damage the guides.

Table 2 provides a list of all-optical modulation mechanisms in silicon waveguides. For each mechanism, the two exponents from Eqn. (3) are shown. For phase modulation mechanisms, the theoretical gate response for the silicon ridge waveguide studied is given, for powers near 5 mW. Also shown is the response achieved in an actual realization. The device response for single-photon absorption, representing the devices described herein, is for a 1.2 cm Mach-Zehnder modulator, with gate power near 5 mW. In writing the exponents, we have assumed that the shift in refractive index is linearly proportional to the number of free carriers, which is approximately valid in the relevant optical power regime. We have also assumed that the bandwidth of the single photon absorption mechanism is limited by the free-carrier lifetime.

The discrepancy between the theoretical and observed performance is due in part to the larger waveguides used in typical realizations, compared to the 0.5×0.1 µm ridge used here, as well as effective lengths that may be less than 1.2 cm. Since carrier injection from TPA (II) is not linear in the input signal, it is impossible to quantify a comparable gate response. The estimate of the single-photon absorption modulator's theoretically best performance assumes that an electron and hole are created with each absorbed photon. One of the works referred to (Q. Xu, and M. Lipson) utilizes resonant enhancement. For clarity of comparison, the projected performance in a non-resonant Mach-Zelinder modulator is shown. Note that the achieved performance in our device exceeds the theoretical limit for the Kerr effect as well as carrier-injected TPA (I).

-continued
$$\int_0^L dz \left( \frac{\left( P_{gate} \exp(-\alpha z) \frac{\tau \sigma}{A} + p_0 \right)^{.8} 8.5 \times 10^{-18} +}{\left( P_{gate} \exp(-\alpha z) \frac{\tau \sigma}{A} + n_0 \right) 8.8 \times 10^{-22}} \right) \frac{\partial n_{eff}}{\partial n_{bulk}} * k_0$$

A similar expression would be used if only a free hole were created, and would in fact provide comparable results, since free holes have a larger influence on the induced refractive index shift. Here, A is the waveguide area, $p_0$ and $n_0$ are equilibrium hole and electron concentrations, $P_{gate}$ is the gate power, $\tau$ the recombination lifetime, $\sigma$ is the absorption density, and $\alpha$ is the optical attenuation coefficient. Eqn. (6) will be nearly linear in the regime for which data were taken.

TABLE 2

ALL-OPTICAL MODULATION MECHANISMS IN SILICON WAVEGUIDES

| Effect | α | β | Bandwidth | Theoretical maximum gate response near 5 mW (degrees/mW) | Typical effective gate response near 5 mW (degrees/mW) |
|---|---|---|---|---|---|
| Electro-optic Modulation | N/A | 1 | Free carrier limited | N/A | N/A |
| Carrier injection from TPA (I) | 2 | 1 | Free carrier limited | 0.1 | 7 × 10⁻⁵ [*] |
| Carrier injection from TPA (II) | 1 | 2 | Free carrier limited | N/A | N/A |
| TPA based absorption | 1 | 1 | Ultrafast | N/A | N/A |
| Kerr Effect | 1 | 1 | Ultrafast | 0.14 | 0.0018 [**] |
| Stimulated Raman Scattering | 1 | 1 | Raman gain bandwidth, 100 GHz | N/A | N/A |
| Single-photon absorption (This work) | 1 | 1 | Apparently free carrier limited | 32 | 1 |

* Q. Xu, and M. Lipson, "All-optical logic based on silicon micro-ring resonators," *Optics Express*, vol. 15, pp. 924-929, 2007.
** Ö. Boyraz, P. Koonath, V. Raghunathan, and B. Jalali, "All optical switching and continuum generation in silicon waveguides," *Optics Express*, vol. 12, pp. 4094-4102, 2004.

Free-Carrier Model of Modulation Effect

If the hypothetical model of the creation of both an electron and hole is used, the shift in electron-hole concentration can be written as:

$$\Delta N = \tau \frac{\sigma}{A} P \qquad \text{Eqn. (4)}$$

Here P is the gate power, and A is the waveguide area. We introduce $\sigma$, the absorption density, which determines the number of photons absorbed per unit length in the waveguide for a given amount of power. The absorption density has units of $cm^{-1}s^{-1}mW^{-1}$. The parasitic loss from absorption will be:

$$\alpha = h \nu \sigma \qquad \text{Eqn. (5)}$$

where h is Planck's constant, and $\nu$ is the relevant photon frequency, around 193 THz.

We could then express the device response using the following free-carrier dispersion relations $$\frac{\partial \phi}{\partial P_{gate}} = -\frac{\partial}{\partial P_{gate}} \qquad \text{Eqn. (5)}$$

Eqn. (6) implicitly assumes that the operation speed is much lower then the bandwidth limitation. As is shown below, as the operation speed approaches the recombination lifetime, the device response in the form of peak-to-peak intensity of the modulated signal has the following behavior:

$$R \propto \frac{1}{\sqrt{1 + (\omega \tau)^2}} \qquad \text{Eqn. (7)}$$

where $\omega$ is the excitation frequency, and $\tau$ is the minority-carrier lifetime. As a result of Eqn. (1), the device response will have a 70% reduction at around $f=1/2\tau$. This occurs near 1 GHz, suggesting a minority carrier lifetime of around 0.5 ns, similar to values reported for similar SOI ridge waveguides. This provides further evidence that the modulation effect is free-carrier mediated.

Calculating Surface-State Absorption Density

Eqn. (6) can be solved for the observed phase shift once the recombination lifetime is known. In the case of the highest performing device, which achieved around 16.6 degrees for 15.5 mW of gate power, the absorption density can be calculated as $1.4 \times 10^{14}$ $cm^{-1}s^{-1}mW^{-1}$. This implies a waveguide loss due to the single photon absorption mechanism of only 0.1 dB/cm, which is a small fraction of the waveguide loss seen. Typical excess carrier concentrations under testing conditions with this density are on the order of $7 \times 10^{14}$ $cm^{-3}$ for 5 mW of gate power.

Geis et al. measured the absorption density directly through a photocurrent measurement. A responsivity of 0.8 A/W was demonstrated in a 0.25 mm device, corresponding to a quantum efficiency of 64%. That implies the optical loss due solely to absorption would be at least 178 dB/cm, and from Eqn. (3) the absorption density can be estimated as $3.1 \times 10^{17}$ cm$^{-1}$s$^{-1}$mW$^{-1}$.

Ultimate Performance Limitations

A complete explanation of the single photon absorption mechanism likely will require further work will be required to understand the single-photon absorption mechanism. One possibility is that an electron is excited into the conduction band from the valence band. In another possibility, the electron is knocked into a defect state, creating a free hole. As holes have a disproportionately large, effect on the refractive index shift in silicon, the creation of a free hole would adequately explain the observed behavior.

Figure 7:
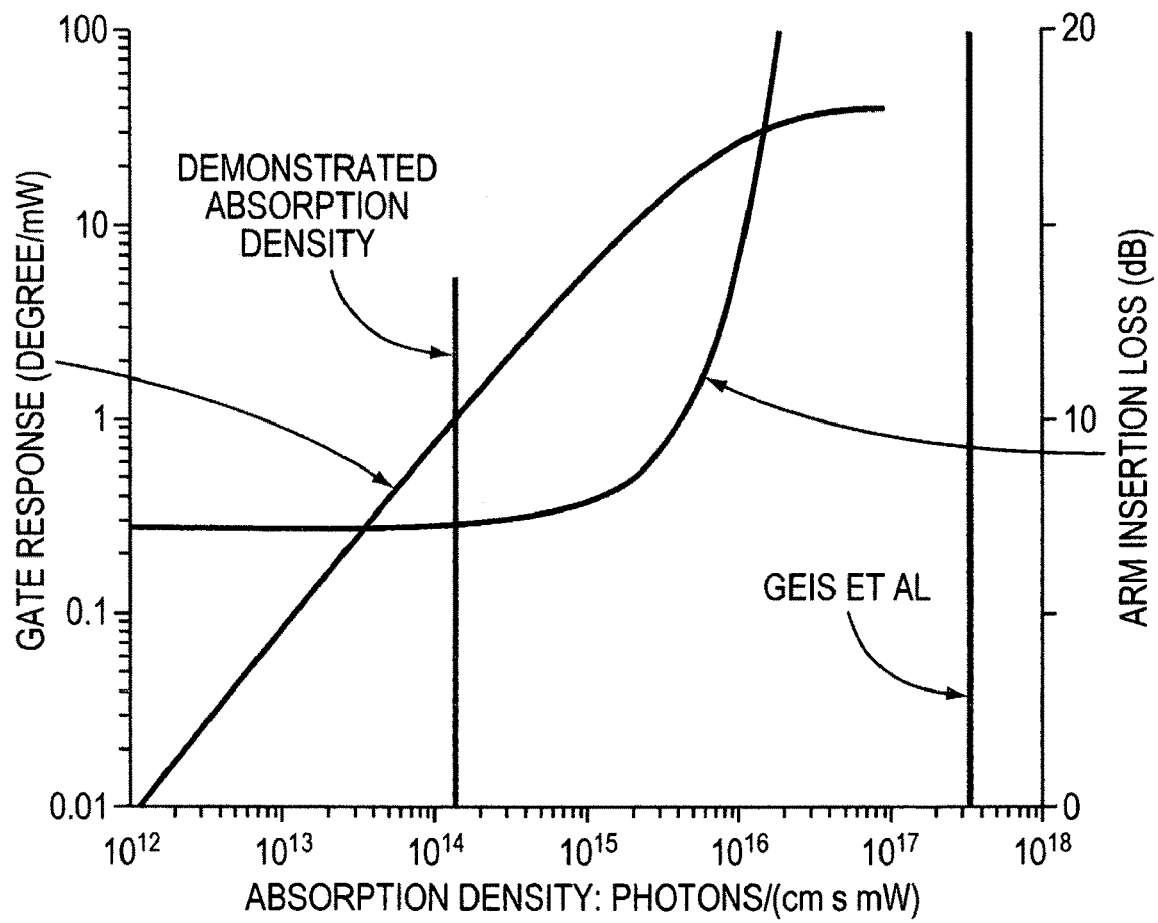
FIG. 7 is a diagram that illustrates projected performance of single photon absorption devices for varying surface-state absorption densities, according to principles of the invention.

We can estimate the ultimate performance limits if we hypothesize that both an electron and hole are created for each absorbed photon. The free-carrier lifetime would determine the ultimate modulation speed. Approaches have been developed to lower this lifetime and frequencies exceeding 5 GBit/sec should be possible. It is also possible to decrease the gate power required for modulation by increasing the density of photon-absorption centers, at the expense of insertion loss. We estimate that, allowing 6 dB of additional loss from implantation-generated defect centers, a gate response of 32 degree/mW could be achieved at 0.5 GBit/sec, corresponding to a $P_\pi$, around 6 mW; this would require around a factor of 100 increase in absorption density over the value currently obtained in our devices. Absorption center densities as much as three orders of magnitude higher than those in this work have been previously engineered, suggesting that these improvements are likely to be possible. FIG. 7 shows a graph of projected performance values for varying absorption densities.

FIG. 7 is a diagram that illustrates projected performance of single photon absorption devices for varying surface-state absorption densities. A response of nearly 32 degree/mW could be obtained for absorption densities a factor of 100 higher than the projected value in our device.

Derivation of Bandwidth Limit for Device

The response of the Mach-Zehnder near the 3 dB bias point of the modulator is proportional to the phase shift induced by the gate signal. This in turn is nearly proportional to the free-carrier density. As a result, the frequency response can be calculated based on the time-dependant equation for the excess carrier concentration:

$$\frac{dN}{dt} = G - \frac{N}{\tau} \qquad \text{Eqn. (8)}$$

where G is the generation rate in cm$^{-3}$s$^{-1}$. Under the experimental conditions of a gate with a sinusoidal intensity modulation, G(t) will have the form $G_0(1+b\cos(\omega t))$. The solution for N in this case is:

$$N(t) = G_0\tau\left(1 + \text{Re}\left(\frac{\exp(i\omega t)}{1+i\omega\tau}\right)\right) \qquad \text{Eqn. (9)}$$

Since the responsivity is proportional to the AC amplitude of N(t), it will have a frequency dependence of $(1+(\omega\tau)^2)^{-1/2}$.

All-Silicon Photodetector Analysis
Exclusion of Heating as a Significant Mechanism A substantial concern that one might have is that the effect seen is solely due to heating of the waveguide. This would mean that such a detector would not be expected function at high speeds, thereby limiting its utility. We note that the conductivity of silicon doped with Boron at $10^{15}$ 1/cm$^3$ should not increase until the temperature reaches 230 C or more. This is due to the fact that $n_i$ for silicon does not approach $10^{15}$ 1/cm$^3$ until this temperature is attained, and thus the conductivity will be mainly due to dopant contributions. We have observed that increasing the temperature does not typically increase device current. We can then examine a device of type A, and note that for the effect to be explained solely by heating, the volume 20 μm$^3$ would have to be heated, by around 200 C. The specific heat of silicon is 702 J kg$^{-1}$ K$^{-1}$, and the density is 2.320 g cm$^{-3}$. This implies that 6.5 nJ would be required to heat the waveguide by this amount.

The device was seen to function, however, with no frequency rolloff to 0.5 MHz with 100 μW of input power. At this higher speed the total amount of energy that can be delivered optically in a single cycle is $2 \times 10^{-10}$ J. Under such conditions, there would not be enough energy to heat the waveguide by the large amount needed. The waveguide used in device type A is identical to the waveguide used in our loss calibration structures. From this, as well as device type A's optical performance, the optical loss in the loop is around 5 dB/cm, implying that only around 4.5% of the energy could be absorbed by all of the loss mechanisms combined. Therefore, the amount of energy that could be expected to participate in a heating mechanism is around 1/1000 of the amount that would be needed for the conductivity to change based on a thermal effect.

It is possible, though unlikely, that the structure could first be heated by the dark current induced by the bias voltage, and then reach a very hot temperature at which the heating response to the optical signal was more pronounced than this analysis would suggest. Experiments were performed in which the sample was heated to a number of temperatures greater than 25 C, and the photocurrent observed. Generally, the photocurrent decreased quickly as temperatures rose. In a typical instance, a temperature rise of 20 C decreased the photocurrent by a factor of 2. This suggests that if there is heating from the DC current, the optical response would actually decrease. It also suggests that the possibility of the waveguide being heated to 200 C and this being the source of the photocurrent is even more remote. One explanation for the decreasing photocurrent is the effect of temperature on minority carrier lifetimes, because the photogenerated electrons will not contribute to the photocurrent if they recombine before reaching an electrode. When cooled to 25 C, the original performance was restored on all devices tested.

Another experiment was performed that also suggests that heating cannot be the source of the effect. As is well known, thermal heating in a ring resonator results in significant shifts in the resonance peaks. This is due to the fact that silicon's index of refraction will change with temperature. The resonance peaks of a ring resonator on the same chip as the detector devices were scanned using several different optical power levels. The levels ranged from around 10 μW to 1 mW. A power of 1 mW is more than 10 times the power level used in most of the detection experiments. In all cases, a negligible shift in peak appearance or location was observed. However, heating the silicon chip by even 40 C shifted the location of the peaks dramatically. This suggests that if there is any optical heating in our experiments, it is likely to be extremely small, probably less than 0.1 C. This is orders of magnitude less heating than could possibly explain a shift in photocurrent.

Exclusion of Two-Photon Absorption as a Significant Mechanism

It is well known that silicon can absorb radiation based on two-photon absorption if illuminated with a sufficiently intense beam of optical radiation. Given that the dimensions of our waveguides are quite small, and the corresponding optical intensities are large, this might seem to be a candidate for the effect seen. However, two-photon absorption is a nonlinear process, with the number of photons absorbed depending on the square of the optical intensity. As a result, an effect based on two-photon absorption would be quadratic in input power—that is, the generated current would be quadratic in input intensity. This is inconsistent with the linear dependence of current with optical power that we have observed. Nevertheless, further experiments were performed to determine whether two-photon processes might be operative.

To determine the amount of two-photon absorption that could be present, calibration structures of two grating couplers and 300 μm of waveguide length were exposed to intense optical radiation beams by using an EDFA. The amount of optical radiation was varied from approximately 100 μW to 200 mW, and the transmission through the device was observed. Linear performance was observed until the illumination power reached 100 mW. The nonlinear loss can then be estimated to be at most approximately 250 dB cm$^{-1}$ W$^{-1}$. Measurements with our detectors were performed with 10 μW of power or less, in devices of length 1000 μm. In such a situation, the nonlinear loss stated previously would imply only 0.00025 dB of loss, corresponding to an optical loss of 0.005%. This would provide an upper bound for the quantum efficiency to around 0.0025%, since for every two photons absorbed in this process, a single electron hole pair would be created. This value, however, is nearly a factor of 1000 less than the efficiency observed. Moreover, the nonlinear loss in silicon at high optical powers is believed not to be due solely to two-photon absorption, but mainly to free carriers that have been created by this process. As a result, the quantum efficiency that could be obtained by two-photon absorption is probably much lower than what was observed.

Mechanism and Identification of Surface States as Source of Photoconductivity

The precise mechanism of the photocurrent is unclear at present. One possibility is that electrons and holes are being created, despite the fact that the photon energy does not exceed the band gap energy of silicon. Another possibility is that only free holes are being created, and the surface state creates a mid-bandgap acceptor state.

If one accepts that the photocurrent is caused by the generation of an electron and a hole through absorption at a defect state, then the question of whether these defects are in bulk or are at the surfaces remains open. To this end, it is useful to compare our device to previous work on optical channel monitors that function based on defects from implant damage. The most salient basis for this comparison is the amount of photocurrent per unit waveguide length. Liu et al. (Y. Liu, C. W. Chow, W. Y. Cheung, H. K. Tsang, "In-Line Channel Power Monitor Based on Helium Ion Implantation in Silicon-on-Insulator Waveguides." IEEE Photon. Technol. Lett. 18, 1882-1884 (2006)) have build a volume defect photodetector in silicon which achieves a quantum efficiency of 5% with around $2 \times 10^{15}$ 1/cm$^3$ of He implants, but in a device that is 1.7 cm long. Our device achieves nearly the same efficiency in around 1/20 of the length. If we assume that there is one defect per Boron dopant in our device, and one defect per helium implant in Liu's device, then a substantial discrepancy exists. That is, with only half of the defects per unit volume, we achieve a similar quantum efficiency to Liu et al in a device that is 20 times shorter. Other considerations only skew this comparison further. It is likely that there are, on average, multiple defects associated with a Helium ion implanted at 800 KeV as compared to including a dopant during the wafer manufacturing process. Moreover, our waveguide geometry has a substantial portion of the mode outside the waveguide, which would only serve to lower the influence of bulk defects.

On the other hand, both Liu et al. and Geis et al. both observed at least some photocurrent with undamaged silicon control samples, though much lower quantum efficiencies of approximately 0.1% were obtained. Geis et al. attributed this, without discussion or supporting data, to a process that occurred on the waveguide surface. We believe that they may have also observed surface state based absorption and generation of electron-hole pairs. The relative difference in efficiencies is probably due to the very different surface modal overlap that our waveguide exhibits.

The best basis for understanding the source of the photoconductive process is an analysis of the source of waveguide loss. It is believed that the generation of an electron-hole pair can be expected to correspond to the absorption of a photon and thus a certain amount of optical loss. Borselli et al. have recently shown that bulk silicon waveguide losses are no more than 0.13 dB/cm in p-type SOI. The SOI used was from SOITEC, and was doped with Boron in nearly identical concentrations to the wafers used for our devices. The fractional decrease in power due to bulk silicon loss over the course of a 1.5 mm device is only 0.45%, which would then be a strict upper bound on the quantum efficiency. Our devices exceed this limit by nearly an order of magnitude. This also strongly suggests that the defect states used by the photoconduction effect are likely to exist at the surface of the silicon waveguide, and are thought to be due to the etched silicon facets.

There are a number of experiments which could further confirm that surface states are the source of the photocurrent. In particular, one could build a detector device as described in this work, and then apply the surface treatment described by Borselli et al., which should remove many of the surface states. Another possibility is to do a more detailed study of the wavelength dependence of the photocurrent, in order to gain insight into what the underlying quantum process is. This was not possible with the current devices, however, due to the limited bandwidth of the grating couplers.

Calculation of the Surface State Density

The strength of the surface state absorption effect can be characterized by a surface state density, a in units of watts$^-$ $_1$s$^{-1}$cm$^{-1}$. It identifies the product of the number of surface states and the optical absorption probability per unit of waveguide. The number of electron-hole pairs generated per second per cm of waveguide can be written as:

$$\frac{EHP}{s \cdot cm} = \sigma I \qquad \text{Eqn. (10)}$$

Assuming a nearly uniform optical intensity throughout the detector, the responsivity for a device of length L can then be written:

$$R = q \sigma L \qquad \text{Eqn. (11)}$$

Here q is the charge of an electron. Based on the responsivity of 36 mA/W for a device of length 1.5 mm, σ can be estimated at $1.5 \times 10^{18}$ watts$^{-1}$s$^{-1}$cm$^{-1}$. This value is comparable to the surface state density calculated for similar samples with all optical measurements.

The waveguide loss can also be written as a function of the surface state density.

$$\alpha >= h\nu\sigma \qquad \text{Eqn. (12)}$$

Here h is Planck's constant, and ν is the optical frequency. The surface state density estimated above corresponds to a waveguide loss of 0.8 dB/cm. This is a significant fraction of the waveguide loss of 5 dB/cm that these waveguides typically exhibit.

We believe that with further optimizations of electrode geometries and processing parameters, improved responsivity can be obtained from surface-state absorption, at higher power and speeds. It is believed that the effect could be used to build a photodetector at 1 GHz or higher, which would be useful for commercial telecommunications applications. It is believed that surface-state absorption is an important component of waveguide losses in nano-scale silicon waveguides. It is believed that measurement of the photoconductivity of waveguide samples can provide a useful tool in loss optimization.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. An all-optical clock, comprising:
   a substrate having a surface;
   a waveguide structure having a gate waveguide and at least one signal waveguide having an input port and an output port, said waveguide structure disposed adjacent said surface of said substrate;
   said gate waveguide of said waveguide structure configured to receive a gate signal;
   said input port of said at least one signal waveguide configured to receive an input optical signal;
   said output port of said at least one signal waveguide configured to provide as output an output signal;
   a signal splitter having an input port and at least two output ports, said signal splitter configured to receive as an input signal said output signal from said output port of said at least one signal waveguide, and configured to provide as an output at each of said at least two output ports a respective portion of said received input signal, one of said at least two output ports configured to deliver said respective portion of said received input signal to a user-selected output for later use; and
   a delay line having an input port configured to receive a signal from one of said at least two output ports of said signal splitter, and an output port configured to deliver said signal received from said splitter to said gate waveguide as said gate signal, said delay line configured to provide said gate signal with a selected delay between a time that said signal is received at said input port of said delay line and said signal is delivered to said gate waveguide.

2. The all-optical clock of claim 1, wherein said at least one signal waveguide is configured as one leg of a Mach-Zehnder interferometer.

3. The all-optical clock of claim 1, wherein said waveguide structure comprises a semiconductor material.

4. The all-optical clock of claim 3, wherein said semiconductor material is silicon.

5. The all-optical clock of claim 3, wherein said semiconductor material is a selected one of silicon, germanium, tin, and alloys thereof.

6. The all-optical clock of claim 3, wherein said semiconductor material is a selected one of a III/V compound and alloys thereof.

7. The all-optical clock of claim 3, wherein said semiconductor material comprises dopants.

8. The all-optical clock of claim 1, further comprising a ring resonator.

9. The all-optical clock of claim 1, wherein said all-optical clock comprises a junction selected from a P-N junction and a P-I-N junction.

10. The all-optical clock of claim 1, further comprising a photodetector configured to receive said optical output signal and configured to provide an electrical output signal representing substantially an electrical equivalent of said optical output signal.

11. A method of operating an all-optical clock, said all-optical clock comprising a substrate having a surface; a waveguide structure having a gate waveguide and at least one signal waveguide having an input port and an output port, said waveguide structure disposed adjacent said surface of said substrate; said gate waveguide of said waveguide structure configured to receive a gate signal; said input port of said at least one signal waveguide configured to receive an input optical signal; said output port of said at least one signal waveguide configured to provide as output an output signal; a signal splitter having an input port and at least two output ports, said signal splitter configured to receive as an input signal said output signal from said output port of said at least one signal waveguide, and configured to provide as an output at each of said at least two output ports a respective portion of said received input signal, one of said at least two output ports configured to deliver said respective portion of said received input signal to a user-selected output for later use; and a delay line having an input port configured to receive a signal from one of said at least two output ports of said signal splitter, and an output port configured to deliver said signal received from said splitter to said gate waveguide as said gate signal, said delay line configured to provide said gate signal with a selected delay between a time that said signal is received at said input port of said delay line and said signal is delivered to said gate waveguide; the method comprising the steps of:
   applying to said input port of said at least one signal waveguide an input optical signal; and
   detecting at said output port of said at least one signal waveguide an optical output signal configured as a periodic signal.

12. The method of operating an all-optical clock of claim 11, wherein said all-optical clock further comprises a photodetector, and wherein said photodetector is configured to receive said optical output signal and configured to provide an electrical output signal representing substantially an electrical equivalent of said optical output signal.

13. The method of operating an all-optical clock of claim 11, wherein said at least one signal waveguide is one leg of a Mach-Zehnder interferometer.

14. The method of operating an all-optical clock of claim 11, wherein said waveguide structure comprises a semiconductor material.

15. The method of operating an all-optical clock of claim 14, wherein said semiconductor material is silicon.

16. The method of operating an all-optical clock of claim 14, wherein said semiconductor material is a selected one of silicon, germanium, tin, and alloys thereof.

17. The method of operating an all-optical clock of claim 14, wherein said semiconductor material is a selected one of a III/V compound and alloys thereof.

18. The method of operating an all-optical clock of claim 14, wherein said semiconductor material comprises dopants.

19. The method of operating an all-optical clock of claim 11, wherein said all-optical clock comprises a junction selected from a P-N junction and a P-I-N junction.

* * * * *